(12) United States Patent
Weigel et al.

(10) Patent No.: US 7,500,397 B2
(45) Date of Patent: Mar. 10, 2009

(54) ACTIVATED CHEMICAL PROCESS FOR ENHANCING MATERIAL PROPERTIES OF DIELECTRIC FILMS

(75) Inventors: Scott Jeffrey Weigel, Allentown, PA (US); Mark Leonard O'Neill, Allentown, PA (US); Raymond Nicholas Vrtis, Orefield, PA (US); Dino Sinatore, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/023,552

(22) Filed: Jan. 31, 2008

(65) Prior Publication Data

US 2008/0199977 A1 Aug. 21, 2008

Related U.S. Application Data

(60) Provisional application No. 60/890,137, filed on Feb. 15, 2007.

(51) Int. Cl.
*H01L 21/311* (2006.01)
(52) U.S. Cl. .................................... 73/714; 438/710
(58) Field of Classification Search .................. 73/714; 438/710
See application file for complete search history.

(56) References Cited

U.S. PATENT DOCUMENTS

| | | | |
|---|---|---|---|
| 5,079,300 A | 1/1992 | Dubrow et al. |
| 5,479,727 A | 1/1996 | Fine et al. |
| 5,576,247 A | 11/1996 | Yano et al. |
| 6,037,275 A | 3/2000 | Wu et al. |
| 6,042,994 A | 3/2000 | Yang et al. |
| 6,208,014 B1 | 3/2001 | Wu et al. |
| 6,318,124 B1 | 11/2001 | Rutherford et al. |
| 6,395,651 B1 | 5/2002 | Smith et al. |
| 6,410,149 B1 | 6/2002 | Hendricks et al. |
| 6,448,331 B1 | 9/2002 | Ioka et al. |
| 6,479,374 B1 | 11/2002 | Ioka et al. |
| 6,495,906 B2 | 12/2002 | Smith et al. |
| 6,518,205 B1 | 2/2003 | Wu et al. |
| 6,521,547 B1 | 2/2003 | Chang et al. |
| 6,566,283 B1 | 5/2003 | Pangrle et al. |
| 6,589,889 B2 | 7/2003 | Endisch et al. |
| 6,713,382 B1 | 3/2004 | Pangrle et al. |
| 6,770,572 B1 | 8/2004 | Wu et al. |
| 7,029,826 B2 | 4/2006 | Hacker et al. |
| 2002/0001973 A1 | 1/2002 | Wu et al. |
| 2004/0096593 A1 | 5/2004 | Lukas et al. |
| 2004/0096672 A1 | 5/2004 | Lukas et al. |
| 2005/0077597 A1 | 4/2005 | Toma et al. |
| 2005/0095840 A1 | 5/2005 | Bhanap et al. |
| 2005/0215072 A1 | 9/2005 | Kevwitch et al. |
| 2006/0057837 A1 | 3/2006 | Bhanap et al. |
| 2006/0057855 A1 | 3/2006 | Ramos et al. |
| 2006/0141641 A1 | 6/2006 | Fan et al. |

FOREIGN PATENT DOCUMENTS

| | | |
|---|---|---|
| EP | 0688052 | 12/1995 |
| EP | 0643421 B1 | 5/2000 |
| EP | 0775669 B1 | 2/2001 |
| WO | 9903926 A1 | 1/1999 |
| WO | 99052136 | 10/1999 |
| WO | 2004068555 A2 | 8/2004 |
| WO | 2005034194 A2 | 4/2005 |
| WO | 2005038863 A2 | 4/2005 |

OTHER PUBLICATIONS

Zielinski, E. M., et al., Damascene Integration of Copper and Ultra-Low-k Xerogel for High Performance Interconnects, Semiconductor Process and Device Center, Texas Instruments, P.O. Box 650311, MS 3702, Dallas, Texas 75265, (972) 995-5261, pp. 31.7.1 to 31.7.3.

*Primary Examiner*—Andre J Allen
(74) *Attorney, Agent, or Firm*—Joseph D. Rossi

(57) ABSTRACT

A method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of: contacting the at least one surface of the layer of silicon-containing dielectric material with a silicon-containing fluid; and exposing the at least one surface of the layer of silicon-containing dielectric material to an energy source selected from the group consisting of: UV radiation, heat, and an electron beam, wherein the layer of silicon-containing dielectric material has a third dielectric constant that is lower than the second dielectric constant after exposing the layer of silicon-containing dielectric material to the energy source.

46 Claims, No Drawings

ACTIVATED CHEMICAL PROCESS FOR ENHANCING MATERIAL PROPERTIES OF DIELECTRIC FILMS

CROSS-REFERENCE TO RELATED APPLICATIONS

This application claims the benefit of priority under 35 U.S.C. § 119(e) to earlier filed U.S. patent application Ser. No. 60/890,137, filed on Feb. 15, 2007, the disclosures of which are incorporated herein by reference in their entireties.

BACKGROUND OF THE INVENTION

The present invention relates to a method for restoring and/or enhancing the material properties of a dielectric material. More particularly, the invention relates to a method for restoring hydrophobicity to the surfaces of low dielectric films which have been subjected to an etching or ashing treatment in such a way as to remove at least a portion of previously existing carbon containing moieties, resulting in a film having reduced hydrophobicity and increased dielectric constant. Such films are used as insulating materials in the manufacture of semiconductor devices such as integrated circuits ("ICs").

As semiconductor devices scale to lower technology nodes, the requirement for lower and lower dielectric constant (k) has been identified to mitigate RC delay. Similarly, as feature sizes in integrated circuits are reduced, problems with power consumption and signal cross-talk have become increasingly difficult to resolve. To achieve lower k (2.6 to 3.0) in dense inorganic materials, carbon has been added to reduce the polarizability thus reducing k. To achieve ultra low k (<2.4) materials, porosity is typically added to the carbon-rich dense matrix. While the introduction of carbon and porosity have reduced k, new challenges during back end of the line (BEOL) processing have also been identified. Specifically during processes such as, for example, etching and ashing, reactive gases have been found to damage the carbon at the surface of dense materials. Other processes such as, for example, wet chemical stripping, CMP, and post-CMP cleaning are also known to damage the surface carbon. Porous low k's suffer more catastrophic effects from reactive etch and ash gases due to diffusion through the film, which causes a greater extent of damage throughout the film. Once the carbon has been removed from the films, the films react with atmospheric moisture and hydroxylate. These hydroxyls adsorb and hydrogen bond with water. Because water has a dielectric constant of about 70, small amounts that are absorbed for dense materials and adsorbed for porous materials cause the dielectric constant to increase significantly. Also, porous materials tend to void after copper annealing due to the high tensile stress fields which will destroy device yields.

It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a long-standing need in the art for further improvements in processing methods and in the optimization of both the dielectric and mechanical properties of such materials. Device scaling in future integrated circuits clearly requires the use of low dielectric constant materials as a part of the interconnect structure. Most candidates for low dielectric constant materials for use in sub-100 nm generation ICs are carbon containing $SiO_2$ films formed by either CVD or spin-on methods. During subsequent processing steps, such as plasma etching and photoresist removal using plasma or wet strip methods, significant damage occurs to these low-k materials, which causes fluorine addition and carbon depletion from the low-k material adjacent to the etched surface. In addition to a higher effective k, the resultant structures are susceptible to void formation, outgassing and blister formation. The voids in turn may cause an increase in leakage current at elevated voltages and reduction in breakdown voltage. Accordingly, there is a desire in the art to repair damage caused to a porous SiCOH-based low-k material.

One way to approach this challenge is to repair the damaged area on dense surfaces, or in the case of porous materials on the surface of the film as well as the internal pore walls with a re-methylating compound called a restoration agent. Restoration agents react with the damaged hydroxylated surfaces to re-alkylate or re-arylate them which in-turn restores the dielectric constant. The following reaction describes an exemplary re-methylation process: SiOH (damaged surface)+RxSi(Cl)y (restoration agent) yields SiOSiRx (repaired surface)+(HCl)y (hydrochloric acid). In the case of porous damaged internal pore wall surfaces, the re-methylation prevents void formation. Many times, the use of a restoration agent allows for conventional etch, ash, and wet cleaning processes to be utilized with low and ultra low dielectric constant materials. The treatment could result in replenishment of carbon to the low-k film, thereby restoring hydrophobicity and resistance to further damage. Additionally, it would be desirable if the repaired low-k material was found to be resistant to void formation, which generally occurs in untreated porous low-k inter-level dielectric regions during copper annealing processes. Re-methylating compounds or silylating agents (which are examples of restoration agents) can methylate the surface of $SiO_2$ based materials. Contemplated exposure includes vapor exposure (with or without plasma), aerosol exposure, spin coating and supercritical $CO_2$. Normally, organosilicate glass (OSG) porous low-k materials are susceptible to void formation in ILD during Cu damascene processing. After treatment with a restoration agent, the resulting structure is significantly more resistant to void formation. Without being bound to any specific theory or mechanism, it is believed that plasma damage causes carbon depletion in the dielectric, by replacing Si—$CH_3$ bonds with Si—OH or SiH bonds depending upon the type of plasmas used, e.g oxidizing and reducing, respectively. In damaged porous dielectrics, the pore surface is now covered with Si—OH bonds. In the presence of tensile stress (such as after Cu annealing), adjacent Si—OH groups can condense, thus causing local densification. The evolving reaction products and the stretching of the molecules due to the new links formed, causes voids to occur near the center of the ILD space. Restoration agents prevent void formation by replacing most Si—OH bonds by Si—O—Si—Rx bonds, which avoid condensation reactions. Therefore void formation does not occur.

Treatment with a restoration agent performed after dielectric trench and via formation using etching, ashing, and wet chemical processes repairs carbon depletion and damage to the low-k materials. By this means, voids are deterred and the low-k materials can withstand internal stresses caused by annealing treatments to the metal filling the trenches and vias.

Treatment with a restoration agent is typically conducted by exposing the wafer surface to the silylating agent in liquid or gas form for a period sufficient to complete the reaction with the damaged low-k region. Optionally, a high temperature bake can be performed to remove remaining solvent and excess restoration agent. Also, optionally, a wet cleaning operation can be performed immediately before the restoration agent application using a material that is chemically compatible with the low-k dielectric material. Additionally a dehydration bake may be performed before the restoration agent treatment to increase effectiveness of the restoration agent.

The effectiveness of the restoration agent can be verified using unpatterned low-k dielectric films subjected to etching and ashing processing followed by treatment with the restoration agent. A successful treatment with a restoration agent results in increased carbon concentration that can be measured by FTIR, EDX, SIMS, or XPS techniques. Additionally, a water contact angle increase is seen after the application of the restoration agent, which demonstrates the hydrophobic nature of the post-treated surface. The restoration agent treated film also shows a lower dielectric constant extracted from C—V measurements, compared to an etched/ashed film that is not treated with restoration agent. In patterned wafers, the effectiveness of the restoration agent treatment is demonstrated by reduction or elimination of voids in the low-k dielectric in narrow spaces between Cu trenches after a copper anneal treatment following electroplating of copper, and also by lower profile change in trenches or vias after exposure to reactive solvents.

U.S. patent application Publication No. 2006/0057855 A1 to Ramos et al. ("the 855 publication") discloses a "toughening agent" composition for increasing the hydrophobicity of an organosilicate glass dielectric film when applied to said film. According to the 855 publication, the toughening agent includes a component capable of alkylating or arylating silanol moieties of the organosilicate glass dielectric film via silylation, and an activating agent selected from the group consisting of an amine, an onium compound and an alkali metal hydroxide. The 855 publication discloses that the toughening treatment is conducted by exposing the wafer surface to the silylating agent in liquid or gas form for a period sufficient to complete the reaction with the damaged low-k region. The 855 publication further discloses that the toughening treatment can also be conducted in the presence of a plasma derived from, for example, a silane compound, however, no such procedure is exemplified. The use of such plasma in a restoration process, however, is likely to suffer from significant drawbacks.

Plasma chemistry is a useful methodology employed in the manufacture of integrated circuit and other electronic devices to deposit and modify film chemistry for a variety of functions within the layers of dielectric material. Plasmas are employed, for example, to deposit interlayer dielectric materials, barrier materials, and capping materials. Other uses include the modification of surfaces using oxidative or reductive atmospheres to increase the surface roughness or change the chemistry in the surface to increase the adhesion between two films, e.g., metal barriers to interlayer dielectric materials or capping materials to copper lines. For the restoration of low dielectric materials after RIE, ashing, and wet cleaning, plasmas may not be the best solution.

Many of the chemistries used to repair dielectric materials will deposit a film under thermal or plasma enhanced CVD processes. Deposition is not necessarily desirable since it may affect the critical dimensions of the feature and may cause issues during packaging due to adhesion and cracking. Similarly, the pore size of many of the dielectric materials ranges from 10-30 Å, therefore small molecules of this dimension are required to insure that the restoration penetrates the damaged portions of the film. Since plasmas are energetic energy sources, there may be gas phase polymerization of the restoration chemistry resulting in molecular sizes greater than the pore size of the dielectric material. These polymerized species will only react at the upper surfaces of the film and not restore the electrical and composition of the entire damaged layer. Two other potential issues with the use of plasmas are: the plasma may cause additional damage to the film due to ion bombardment; and the plasma relies on the ions and other neutral species in the line of site of the features being formed and may minimally interact on the sidewalls of the trenches and vias where it is crucial to repair the damage, i.e., diffusion of plasma generated species may be slow. Plasmas also have the ability to roughen surfaces which may not be desirable for the sidewalls of trenches and vias.

Moreover, with either gas phase or liquid phase restoration processes, a potential exists for leaving residue or chemical species trapped within the dielectric material, particularly during BEOL processing. Although the surfaces of the film are made hydrophobic and the dielectric constant restored by applying silylating chemistries, the silylating species is known to become trapped in the dielectric layer followed by unwanted outgassing during subsequent processing steps, especially those steps that occur at elevated temperatures such as, for example, thermal cycling between temperatures of about 50° C. and about 450° C. Such outgassing causes defects (e.g., pinholes, adhesion, and delamination) created by vapors escaping from the dielectric material during the deposition of metal barriers and capping layers which typically leads to the re-adsorption of water, copper migration into the dielectric layer, and adsorption of other atmospheric contaminants. Each of these issues will cause decreased reliability and modify the performance of the final device. Accordingly, there is a need in the art for a method for restoring dielectric properties of a dielectric material that does not suffer from the above-identified drawbacks.

BRIEF SUMMARY OF THE INVENTION

During BEOL processing of ICs, dielectric material layers on semiconductor substrates are exposed to processes for metalization such as, for example, plasmas and both gas and liquid phase chemistries used to pattern and define features in a dual damascene process. A loss of the layers' dielectric propertites and changes in the chemical composition of the dielectric material are typically experienced as a result of the damaged cause by the harsh chemistry and conditions associated with such processes. Such damage may even impact the mechanical strength of the layer. In response to this problem, the present invention is directed to a method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of: contacting the at least one surface of the layer of silicon-containing dielectric material with a silicon-containing fluid; and exposing the at least one surface of the layer of silicon-containing dielectric material to an energy source selected from the group consisting of: UV radiation, heat, and an electron beam, wherein the layer of silicon-containing dielectric material has a third dielectric constant that is lower than the second dielectric constant after exposing the layer of silicon-containing dielectric material to the energy source.

In another aspect, the present invention provides a method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of: contacting the at least one surface of the layer of silicon-containing dielectric material with a silicon-containing fluid; removing a first portion of the silicon-containing fluid such that a second portion of the silicon-containing fluid remains in contact with the at least one surface of the layer of silicon-containing dielectric material; and exposing the at least one surface of the layer of silicon-containing dielectric material to UV radiation and thermal energy, wherein the layer of silicon-containing dielectric material has a third dielectric constant that is lower than the second dielectric constant after exposing the layer of dielectric material to the energy source.

In yet another aspect, the present invention provides a method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of: contacting the at least one surface of the layer of silicon-containing dielectric material with a silicon-containing fluid comprising an alkylalkoxysilane; removing a first portion of the silicon-containing fluid such that a second portion of the silicon-containing fluid remains in contact with the at least one surface of the layer of silicon-containing dielectric material; and exposing the at least one surface of the layer of silicon-containing dielectric material to UV radiation and thermal energy, wherein the layer of silicon-containing dielectric material has a third dielectric constant that is lower than the second dielectric constant after exposing the layer of silicon-containing dielectric material to the energy source.

DETAILED DESCRIPTION OF THE INVENTION

The present invention is directed to the preparation of porous low dielectric materials and films such as, for example, those employed as interlayer dielectrics in integrated circuits. In particular, the present invention is directed to a method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of: contacting the at least one surface of the layer of silicon-containing dielectric material with a silicon-containing fluid; and exposing the at least one surface of the layer of silicon-containing dielectric material to an energy source selected from the group consisting of: UV radiation, heat, and an electron beam, wherein the layer of silicon-containing dielectric material has a third dielectric constant that is lower than the second dielectric constant after exposing the layer of silicon-containing dielectric material to the energy source. As used herein, the term "a layer" or "the layer" as it refers to the dielectric material means at least a portion of at least one layer of dielectric material whether patterned or not.

In preferred embodiments of the present invention, a layer of silicon-containing dielectric material is disposed on a substrate. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semiconductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

In the method of the present invention, the layer of silicon-containing dielectric material can be formed from the deposition of a film-forming composition comprising a compound or compounds that are capable of forming and maintaining an interconnect network. Examples of silicon-containing dielectric films include, but are not limited to, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, organic-inorganic composite materials, porous organic and inorganic composite materials, borosilicate glass (Si:O:B:H), or phosphorous doped borosilicate glass (Si:O:B:H:P), and combinations thereof.

In preferred embodiments of the present invention, the layer of silicon-containing dielectric material comprises a silica material (i.e., a silica-containing dielectric material). The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In alternative embodiments, the at least one layer of dielectric material may contain, for example, other elements such as, but not limited to, Al, Ti, V, In, Sn, Zn, Ga, and combinations thereof. In certain preferred embodiments, the at least one layer of dielectric material may comprise an organosilicon glass ("OSG") compound represented by the formula $Si_vO_wC_xH_yF_z$, where $v+w+x+y+z=100$ atomic %, v is from 10 to 35 atomic %, w is from 10 to 65 atomic %, x is from 5 to 30 atomic %, y is from 10 to 50 atomic % and z is from 0 to 15 atomic %.

In preferred embodiments of the present invention, the layer of silicon-containing dielectric material is porous, i.e., such layer(s) is/are characterized by the presence of pores. In such embodiments, pores can be formed, for example, when the film-forming composition comprises a silica source and at least one porogen that is capable of being easily and, preferably, substantially removed upon exposure to one or more energy sources. A "porogen" is a reagent that is used to generate void volume within the resultant film. Regardless of whether or not the porogen is unchanged throughout the inventive process, the term "porogen" as used herein is intended to encompass pore-forming reagents (or pore-forming substituents) and derivatives thereof, in whatever forms they are found throughout the entire process described herein. Suitable compounds to be used as the porogen include, but are not limited to, hydrocarbon materials, labile organic groups, solvents, decomposable polymers, surfactants, dendrimers, hyper-branched polymers, polyoxyalkylene compounds, compounds comprising C and H, or combinations thereof. In certain embodiments, the porogen comprises a $C_1$ to $C_{13}$ hydrocarbon compound. Preferred porogens to be employed in a CVD process include, for example, alpha-terpinene, cyclooctane, norbornadiene, cyclooctadiene, bicyclohexadiene, cyclohexene, cyclohexane, limonene, 1,3-butadiene, 1-neohexyl-1,3,5,7-tetramethylcyclotetrasiloxane, 1-neopentyl-1,3,5,7-tetramethylcyclotetrasiloxane, neopentyldiethoxysilane, neohexyldiethoxysilane, neohexyltriethoxysilane, neopentyltriethoxysilane, neopentyl-di-t-butoxysilane, and heteroatomic porogens, such as cyclopentanol, cyclohexene oxide, cyclopentene oxide, cyclohexanone, cyclopentylamine, and mixtures thereof. Preferred porogens to be employed in a spin-on process include, for example, solvents, decomposable polymers, surfactants, dendrimers, hyperbranched polymers, polyoxyalkylene compounds, and mixtures thereof.

In forming pores, the as-deposited material from which the at least one layer of dielectric material is made is typically exposed to one or more energy sources to cure the film and/or remove at least a portion of the porogen contained therein if present. Exemplary energy sources may include, but are not limited to, an ionizing radiation source such as α-particles, β-particles, γ-rays, x-rays, electron beam sources of energy; a nonionizing radiation source such as ultraviolet (10 to 400 nm), visible (400 to 750 nm), infrared (750 to $10^5$ nm), microwave (>$10^6$), and radio-frequency (>$10^6$) wavelengths of energy; or compositions thereof. Still further energy sources include thermal energy and plasma energy. Depending upon the energy source, the exposure step can be conducted under high pressure, atmospheric, or under a vacuum. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), amines, ammonia, etc.). The temperature for the exposure step may range from 100 to 500° C. In certain embodiments, the temperature may be ramped at a rate is from 0.1 to 100° C./min. The total treatment time is preferably from 0.01 min to 12 hours.

For example, in embodiments where the pores are formed by photocuring for the removal of the porogen and/or perfecting the lattice structure of the film, such process is conducted under the following conditions: the environment can be inert (e.g., nitrogen, $CO_2$, noble gases (He, Ar, Ne, Kr, Xe), etc.), oxidizing (e.g., $O_2$, $N_2O$) (for certain embodiments), or reducing (e.g., dilute or concentrated hydrocarbons, hydrogen, amines, ammonia, etc.). The temperature is preferably about 25° C. to about 500° C. The wavelengths are preferably IR, visible, UV or deep UV (wavelengths <200 nm). The total curing time is typically anywhere from 0.01 min to 12 hours.

The layer of silicon-containing dielectric material is typically formed as a film onto at least a portion of the substrate (which may include additional layers such as, for example, conductive layers and etch stop barrier layers) from a film-forming composition using a variety of different methods. These methods may be used by themselves or in combination. Some examples of processes that may be used to form the films include the following: thermal chemical vapor deposition, plasma enhanced chemical vapor deposition ("PECVD"), high density PECVD, photon assisted CVD, plasma-photon assisted ("PPECVD"), atomic layer deposition (ALD), cryogenic chemical vapor deposition, chemical assisted vapor deposition, hot-filament chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the film. Besides chemical vapor deposition processes, other processes that can be used to apply the at least one layer of dielectric material such as, for example, non-contact deposition methods. Non-contact deposition methods typically allow films to be formed without the need of contact masks or shutters. Non-contact deposition methods include, for example, dipping, rolling, brushing, spraying, extrusion, spin-on deposition, air-knife, printing, and combinations thereof. Further exemplary deposition methods include oscillating non-contact induced spreading forces, gravity-induced spreading forces, wetting-induced spreading forces, slot extrusion, and combinations thereof.

The silicon-containing layer of dielectric material according to the present invention has at least one surface. As used herein, the term "surface" includes any gaseous/solid interface, liquid/solid interface, including, for example, pore mouths, pores themselves, interconnectivity of the pores, and porosity within the framework structure. It should be understood, however, that the damage and restoration of the damaged dielectric material according to the present invention can occur at the surfaces and/or within the matrix of the material.

The layer of silicon-containing dielectric material according to the present invention has a first dielectric constant. As used herein, the term "first dielectric constant" refers to the dielectric constant of the layer of silicon-containing dielectric material after it is formed and before it is further processed in the semiconductor manufacturing process such as, for example, in a manner that will damage the dielectric constant. Because the present invention is directed to both porous and dense dielectric layers, if the layer of silicon-containing dielectric material is porous then the first dielectric constant will typically be lower than a dense layer of silicon-containing dielectric material because air is introduced into the dielectric material. Air has a dielectric constant of 1.0, and when air is introduced into a dielectric material in the form of nanoporous or nanometer-scale pore structures, relatively low dielectric constants ("k") are achieved. Preferably, the layer of silicon-containing dielectric material according to the present invention has a first dielectric constant of from about 1.5 to about 3.5, more preferably from about 1.5 to about 2.8, and most preferably from about 1.8 to about 2.7.

As mentioned above, processes such as, for example, etching, ashing, wet chemical stripping, CMP, post-CMP cleaning, and other plasma processes have been found to damage or remove the carbon from the OSG dielectric material. Such damage typically manifests in the loss of the film's dielectric properties and a change the film's chemical composition. For example, it is well known that damage to organosilicate glass dielectric films during semiconductor manufacturing processes results from the application of plasmas (either remote or in situ) and/or etching reagents to etch trenches and vias into dielectric films and typically causes a reduction in the Si—$CH_3$ species exposed to the process. Plasmas, for example, are used to remove photoresist films during fabrication of semiconductor devices and are typically composed of the elements oxygen, fluorine, hydrogen, carbon, argon, helium or nitrogen (in the form of free atoms, compounds, ions and/or radicals).

Wet chemical treatments are also employed in IC production for the purpose of removing residues remaining after trench or via etching, photoresist ashing, photoresist removal, or hardened photoresist removal. The chemicals used are designed to remove carbon-containing residues and polymers on, for example, the sidewalls of the features and, therefore, they have the potential to attack and remove organic groups in silica based dielectric films, especially porous silica films. Damage typically includes not only an increase in the material's dielectric constant, but also a loss in the hydrophobicity of the material. Components of wet chemical etchants that contribute to such damage may include, for example, amides, such as N-methylpyrrolidinone, dimethylformamide, dimethylacetamide; alcohols such as ethanol and 2-propanol; alcoholamines such as ethanolamine; amines such as triethylamine; diamines such as ethylenediamine and N,N-diethylethylenediamine; triamines such as diethylenetriamine, diamine acids such as ethylenediaminetetracetic acid "EDTA"; organic acids such as acetic acid and formic acid; the ammonium salts of organic acids such as tetramethylammonium acetate; inorganic acids such as sulfuric acid, nitric acid, phosphoric acid, hydrofluoric acid; fluoride salts such as ammonium fluoride, ammonium bifluoride; and bases such as ammonium hydroxide and tetramethyl ammonium hydroxide; and hydroxylamine. Although harsh, such components are often necessary for the wet chemicals treatment to perform their function properly.

Porous low dielectric silicon-containing materials typically suffer more catastrophic effects than dense dielectric films from exposure to reactive etch and ash gases and harsh chemicals due to diffusion through the film, which causes a greater extent of damage throughout the film because of the increased surface area that is an affectation of porous low-k dielectric materials relative to dense dielectric materials. Without intending to be bound by a particular theory, it is thought that a portion of the silicon-carbon bonds in the silicon-containing material such as, for example, silicon-methyl bonds are broken during such processes and replaced with silicon-hydrogen (Si—H) bonds or silicon-hydroxide (Si—OH) bonds. The Si—H and Si—OH bonds themselves, in addition to having an inherent negative impact on the material's dielectric constant, are also detrimental because they are capable of strongly adsorbing water which leads to an additional undesired increase in the dielectric constant of the material. Thus, for example, a layer of a silicon-containing dielectric material such as, for example, a silica-containing dielectric film that has an organic content (such as methyl groups bonded to Si atoms) is readily degraded when exposed to an oxygen plasma and a silanol (Si—OH) group is typically formed in the material where the organic group formerly resided. Because water has a dielectric constant of about 70, small amounts that are absorbed for dense materials and adsorbed for porous materials cause the dielectric constant to increase. The increase in dielectric constant as a result of damage relative to the first dielectric constant, regardless of whether the material is dense or porous, is herein referred to as the "second dielectric constant". Thus, the value of the second dielectric constant may depend on a number of variables such as, for example, the first dielectric constant of the dielectric material, the chemical nature of the dielectric material, and the harshness of the BEOL process chemistry used to create the trenches and vias. Typically, however, the second dielectric constant is from about 5% to about 200% higher than the value of the first dielectric constant.

The present invention provides a method by which certain material properties of the damaged dielectric material are restored. As used herein, the terms "restore", "repair", "recovery", and "restoration" are used synonomously and refer to an improvement in the material properties of the damaged dielectric material such as, for example, breakdown voltage, leakage current, hydrophobicity, mechanical strength, carbon content, diffusion resistance, adhesion, modification of pore size, and hermeticity. The method of the present invention restores carbon-containing moieties and increases the hydrophobicity of the organosilicate glass low dielectric material. This makes the dielectric material resistant to stresses on the via and trench walls, such as induced by metal shrinkage during annealing, stress from other dielectric layers, and stress during packaging. This also deters undesirable voids from forming inside the dielectric material between the vias and trenches.

The method of the present invention includes the step of contacting the at least one surface of the layer of dielectric material with a silicon-containing fluid to cover the surfaces of, for example, the pores and pore mouths (or the surface of a dense dielectric material). As used herein, the term "cover" means that the silica-containing fluid coats the surface and/or wets the surface of the dielectric material. Preferably, as it coats and/or wets the at least one surface, the silicon-containing fluid is at least partially absorbed and/or adsorbed into the dielectric material and/or the surfaces thereof. As used herein, the term "fluid" includes liquids, gases, vapors, aerosols, supercritical fluids, and sublimed solids. The step of contacting the at least one layer with a silicon-containing fluid can occur by methods known to those skilled in the art such as, for example, a gaseous delivery via, for example, a chemical vapor deposition chamber (referred to herein as "CVD") or a liquid delivery such as, for example, by spin-coating. Other methods may also be used to apply the at least one layer of dielectric material such as, for example, dipping, rolling, brushing, spraying, liquid misted deposition, aerosols, extrusion, spin-on deposition, air-knife, printing, and combinations thereof. Further exemplary deposition methods include oscillating non-contact induced spreading forces, gravity-induced spreading forces, wetting-induced spreading forces, slot extrusion, and combinations thereof. For liquid silicon-containing fluids, the preferred contact method is a spin-on process. For gaseous or vaporized liquid silicon-containing fluids, the preferred contact method is by CVD.

The silicon-containing fluids employed according to the present invention include, for example, silica-containing precursors such as, for example, those that are typically employed to form a dielectric material. The type of silicon-containing fluid employed may depend on, for example, the desired method to be employed for the contacting step.

The following silicon-containing fluids are suitable for use in the present invention in either a spin-on deposition process or a CVD process. As such, at least one of the following silicon-containing fluids typically form the composition that will be applied in connection with the contacting step along with optionally a solvent. The solvent, if employed, preferably is a solvent that has a boiling point in the range of from about 50° C. to about 300° C., more preferably in the range of from about 70° C. to about 250° C. Suitable solvents include alcohols, aldehydes, ketones, esters, amides, glycols, glycol ethers, water, ethers, epoxides, amines, and mixtures thereof. Specific examples of solvents include cyclohexanone, 2-hexanone, 2-pentanone, 1-pentanol, 1-butanol, 2-propanol, propylene glycol propyl ether, propylene glycol monomethyl ether acetate, ethyl lactate, pentyl acetate, propylene glycol, propylene glycol monomethyl ether, N,N-dimethylformamide, and mixtures thereof. In embodiments wherein a solvent is employed, the silica-containing fluid comprises preferably from about 0.001 to 99 weight percent, and more preferably from about 0.01 to about 90 weight percent of the total weight of the fluid with the remainder being the solvent and, optionally, additives such as, for example, catalysts, flow aids, wetting agents, pH adjusters, corrosion inhibitors, ionic strength adjusters, and surfactants. Such additives, if present, may function to change the pH of the mixture, aid the silica-containing fluid in wetting and interacting with small features by modifying the surfaces with which the fluid interacts, change the fluid's viscosity, surface tension, and solubility parameters. Such additives may also function to minimize the corrosion of copper, and increase the reactivity of the silicon-containing fluids fluid towards the damage and defects created by BEOL processing.

In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R_aSi(OR^1)_{4-a}$, when "a" is 2, the two R groups need not be identical to each other or to $R^1$. In addition, in the following formulas, the term "monovalent organic group" relates to an organic group bonded to an element of interest, such as Si or O, through a single C bond, i.e., Si—C or O—C. Examples of monovalent organic groups include an alkyl group, an aryl group, an unsaturated alkyl group, and/or an unsaturated alkyl group substituted with alkoxy, ester, acid, carbonyl, or alkyl carbonyl functionality. The alkyl group may be a linear, branched, or cyclic alkyl group having from 1 to 5 carbon atoms such as, for example, a methyl, ethyl, propyl, butyl, or pentyl group. Examples of aryl groups suitable as the monovalent organic group include phenyl, methylphenyl, ethylphenyl and fluorophenyl. In certain embodiments, one or more hydrogens within the alkyl group may be substituted with an additional atom such as a halide atom (i.e., fluorine), or an oxygen atom to give a carbonyl or ether functionality. Examples of ($OR^1$) can be alkoxy, acetoxy, hydroxyl, siloxanolates, and silanolates.

In certain preferred embodiments, the silicon-containing fluid may be represented by the following formula: $R_aSi(OR^1)_{4-a}$, wherein R independently represents a hydrogen atom, a fluorine atom, or a monovalent organic group; $R^1$ independently represents a monovalent organic group; and a is an integer ranging from 1 to 2. Specific examples of the compounds represented by $R_aSi(OR^1)_{4-a}$ include: methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltin-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane; sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, isobutyltrimethoxysilane, isobutyltriethoxysilane, isobutyltri-n-propoxysilane, isobutyltriisopropoxysilane, isobutyltri-n-butoxysilane, isobutyltri-sec-butoxysilane, isobutyltri-tert-butoxysilane, isobutyltriphenoxysilane, n-pentyltrimethoxysilane, n-pentyltriethoxysilane, n-pentyltri-n-propoxysilane, n-pentyltriisopropoxysilane, n-pentyltri-n-butoxysilane, n-pentyltri-sec-butoxysilane, n-pentyltri-tert-butoxysilane, n-pentyltriphenoxysilane; sec-pentyltrimethoxysilane, sec-pentyltriethoxysilane, sec-pentyltri-n-propoxysilane, sec-pentyltriisopropoxysilane, sec-pentyltri-n-butoxysilane, sec-pentyltri-sec-butoxysilane, sec-pentyltri-tert-butoxysilane, sec-pentyltriphenoxysilane, tert-pentyltrimethoxysilane, tert-pentyltriethoxysilane, tert-pentyltri-n-propoxysilane, tert-pentyltriisopropoxysilane, tert-pentyltri-n-butoxysilane, tert-pentyltri-sec-butoxysilane, tert-pentyltri-tert-butoxysilane, tert-pentyltriphenoxysilane, isopentyltrimethoxysilane, isopentyltriethoxysilane, isopentyltri-n-propoxysilane, isopentyltriisopropoxysilane, isopentyltri-n-butoxysilane, isopentyltri-sec-butoxysilane, isopentyltri-tert-butoxysilane, isopentyltriphenoxysilane, neo-pentyltrimethoxysilane, neo-pentyltriethoxysilane, neo-pentyltri-n-propoxysilane, neo-pentyltriisopropoxysilane, neo-pentyltri-n-butoxysilane, neo-pentyltri-sec-butoxysilane, neo-pentyltri-neo-butoxysilane, neo-pentyltriphenoxysilane phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, δ-trifluoropropyltrimethoxysilane, δ-trifluoropropyltriethoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldimethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldimethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, methylneopentyldimethoxysilane, methylneopentyldiethoxysilane, methyldimethoxysilane, ethyldimethoxysilane, n-propyldimethoxysilane, isopropyldimethoxysilane, n-butyldimethoxysilane, sec-butyldimethoxysilane, tert-butyldimethoxysilane, isobutyldimethoxysilane, n-pentyldimethoxysilane, sec-pentyldimethoxysilane, tert-pentyldimethoxysilane, isopentyldimethoxysilane, neopentyldimethoxysilane, neohexyldimethoxysilane, cyclohexyldimethoxysilane, phenyldimethoxysilane, diethoxymethylsilane, ethyldiethoxysilane, n-propyldiethoxysilane, isopropyldiethoxysilane, n-butyldiethoxysilane, sec-butyldiethoxysilane, tert-butyldiethoxysilane, isobutyldiethoxysilane, n-pentyldiethoxysilane, sec-pentyldiethoxysilane, tert-pentyldiethoxysilane, isopentyldiethoxysilane, neopentyldiethoxysilane, neohexyldiethoxysilane, cyclohexyldiethoxysilane, phenyldiethoxysilane, trimethoxysilane, triethoxysilane, tri-n-propoxysilane, triisopropoxysilane, tri-n-butoxysilane, tri-sec-butoxysilane, tri-tert-butoxysilane, triphenoxysilane, allyltrimethoxysilane, allyltriethoxysilane, vinyltrimethoxsilane, vinyltriethoxysilane, (3-acryloxypropyl)trimethoxysilane, allyltrimethoxysilane, allyltriethoxysilane, vinyltrimethoxsilane, vinyltriethoxysilane, and (3-acryloxypropyl) trimethoxysilane. Of the above compounds, the preferred compounds are methyltrimethoxysilane, methyltriethoxysilane, methyltri-n-propoxysilane, methyltriisopropoxysilane, ethyltrimethoxysilane, ethyltriethoxysilane, dimethyldimethoxysilane, dimethyldiethoxysilane, diethoxymethylsilane, diethyldimethoxysilane, and diethyldiethoxysilane.

The silicon-containing fluid may also be a compound having the formula $Si(OR^2)_4$ wherein $R^2$ independently represents a monovalent organic group. Specific examples of the compounds represented by $Si(OR^2)_4$ include tetramethoxysilane, tetraethoxysilane, tetra-n-propoxysilane, tetraisopropoxysilane, tetra-n-butoxysilane, tetra-sec-butoxysilane, tetra-tert-butoxysilane, tetraacetoxysilane, and tetraphenoxysilane. Of the above, certain preferred compounds may include tetramethoxysilane, tetraethoxysilane, tetra-n-propoxysilane, tetraisopropoxysilane, or tetraphenoxysilane.

The silicon-containing fluid may also be a compound having the formula $R^3{}_b(R^4O)_{3-b}Si—(R^7)—Si(OR^5)_{3-c}R^6{}_c$, wherein $R^3$ and $R^6$ are independently a hydrogen atom, a fluorine atom, or a monovalent organic group; $R^4$ and $R^5$ are independently a monovalent organic group; b and c may be the same or different and each is a number ranging from 0 to 2; $R^7$ is an oxygen atom, a phenylene group, a biphenyl, a naphthalene group, or a group represented by $—(CH_2)_n—$, wherein n is an integer ranging from 1 to 6; or combinations thereof. Specific examples of these compounds wherein $R^7$ is an oxygen atom include: hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane. Of those, preferred compounds are hexamethoxydisiloxane, hexaethoxydisiloxane, hexaphenoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane;and 1,3-diethoxy-1,1,3,3-tetraphenyldisiloxane. Specific examples of these compounds wherein $R^7$ is a group represented by $—(CH_2)_n—$ include: bis(trimethoxysilyl)methane, bis(triethoxysilyl)methane, bis(triphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, 1,2-bis(trimethoxysilyl)ethane, 1,2-bis(triethoxysilyl)ethane, 1,2-bis(triphenoxysilyl)ethane, 1,2-bis(dimethoxymethylsilyl)ethane, 1,2-bis(diethoxymethylsilyl)ethane, 1,2-bis(dimethoxyphenylsilyl)ethane, 1,2-bis(diethoxyphenylsilyl)ethane, 1,2-bis(methoxydimethylsilyl)ethane, 1,2-bis(ethoxydimethylsilyl)ethane, 1,2-bis(methoxydiphenylsilyl)ethane, 1,2-bis(ethoxydiphenylsilyl)ethane, 1,3-bis(trimethoxysilyl)propane, 1,3-bis(triethoxysilyl)propane, 1,3-bis(triphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl)propane. Of those, preferred compounds are bis(trimethoxysilyl)methane, bis(triethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, and bis(ethoxydiphenylsilyl)methane.

In certain preferred embodiments of the present invention, $R^1$ of the formula $R_aSi(OR^1)_{4-a}$; $R^2$ of the formula $Si(OR^2)_4$; and $R^4$ and/or $R^5$ of the formula $R^3{}_b(R^4O)_{3-b}Si—(R^7)—Si(OR^5)_{3-c}R^6{}_c$ can each independently be a monovalent organic group of the formula:

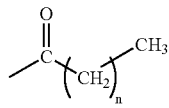

wherein n is an integer from 0 to 4. Specific examples of these compounds include: tetraacetoxysilane, methyltriacetoxysilane, ethyltriacetoxysilane, n-propyltriacetoxysilane, isopropyltriacetoxysilane, n-butyltriacetoxysilane, sec-butyltriacetoxysilane, tert-butyltriacetoxysilane, isobutyltriacetoxysilane, n-pentyltriacetoxysilane, sec-pentyltriacetoxysilane, tert-pentyltriacetoxysilane, isopentyltriacetoxysilane, neopentyltriacetoxysilane, phenyltriacetoxysilane, dimethyldiacetoxysilane, diethyldiacetoxysilane, di-n-propyldiacetoxysilane, diisopropyldiacetoxysilane, di-n-butyldiacetoxysilane, di-sec-butyldiacetoxysilane, di-tert-butyldiacetoxysilane, diphenyldiacetoxysilane, triacetoxysilane. Of these compounds, dimethyldiacetoxysilane, trimethylacetoxysilane, and methyltriacetoxysilane are preferred.

In other embodiments of the present invention, the silicon-containing fluid may preferably have an at least one carboxylic acid ester bonded to the Si atom. Examples of these silica sources include methyltriacetoxysilane, ethyltriacetoxysilane, and phenyltriacetoxysilane. In addition to the at least one silicon-containing fluid wherein the silicon-containing fluid has at least one Si atom having a carboxylate group attached thereto, the composition may further comprise additional silicon-containing fluids that may not necessarily have the carboxylate attached to the Si atom.

In yet another embodiment the silicon-containing fluid is a silazane such as, for example, hexamethydisilazane, heptamethyldisialzane, and hexamethycyclotrisilazane. In yet another embodiment the silicon-containing fluid is an amino silane such as, for example, dimethylaminosilane, dimethylaminotrimethylsilane, aminopropyldimethylethoxysilane, and bis(dimethylamino)dimethylsilane. In yet another embodiment the silicon-containing fluid is a cyclic siloxane such as, for example, tetramethylcyclotetrasiloxane (TM-CTS), and octamethylcyclotetrasiloxane (OMCTS), hexamethylcyclotrisiloxane, decamethylcyclopentasilane, dodecamethylcyclohexasilane. In still yet another embodiment, the silicon-containing fluid is a carbosilane such as, for example, 1,methyl-1-ethoxy-silacyclopentane, 2,2,4,6,6-pentamethyl-2,4,6-trisila-heptane, 1,1,3,3-tetramethyl-1,3-disilacyclobutane, and 1,3-dimethyl-1,3-diethoxy-1,3-disilacyclobutane.

In embodiments of the present invention wherein a CVD process is employed in connection with the contacting step, gaseous reagents are preferred. Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor. In such process, gaseous reagents typically flow into a reaction chamber such as, for example, a vacuum chamber, and an equilibrium is allowed to be reached between the gaseous reagents (i.e., fluid) and the material. Optionally, this can be followed by evacuation of the gaseous reagents and/or solvent rinsing or otherwise removing excess fluid. Flow rates for each of the gaseous reagents may range from 10 to 5000 sccm. Pressure values in the vacuum chamber during the contact step may range from 0.01 to 600 torr, more preferably 1 to 50 torr. In certain embodiments, the deposition is conducted at a temperature ranging from 25 to 425° C., or from 100 to 425° C., or from 150 to 300° C. It is understood however that process parameters such as flow rate, pressure, and temperature may vary depending upon numerous factors such as the surface area of the substrate, the precursors employed, and the equipment employed in the process.

In one embodiment of the CVD process wherein the at least one layer of silicon-containing dielectric material is porous and comprises Si, C, O, H, and F, the contacting step is performed by providing a substrate comprising the at least one layer of porous dielectric material within a vacuum chamber; introducing into the vacuum chamber gaseous reagents that comprises at least one silicon-containing fluid selected from the group consisting of an organosilane and an organosiloxane; allowing equilibrium to be reached between the at least one silicon-containing fluid and the material; and removing the excess of the at least one silicon-containing fluid.

Silicon-containing fluids such as organosilanes and organosiloxanes are preferred in the chemical vapor deposition contacting step. Suitable organosilanes and organosiloxanes include, e.g.: (a) alkylsilanes represented by the formula $R^{11}{}_n SiR^{12}{}_{4-n}$, where n is an integer from 1 to 3; $R^{11}$ and $R^{12}$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, trimethylphenoxysilane and phenoxysilane); (b) a linear organosiloxane represented by the formula $R^{11}(R^{12}{}_2 SiO)_n SiR^{12}{}_3$ where n is an integer from 1 to 10, or cyclic organosiloxane represented by the formula $(R^1 R^2 SiO)_n$ where n is an integer from 2 to 10 and $R^{11}$ and $R^{12}$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^{12}(SiR^{11}R^{12})_n R^{12}$ where n is an integer from 2 to 10, or cyclic organosilane represented by the formula $(SiR^1 R^2)_n$, where n is an integer from 3 to 10, and $R^{11}$ and $R^{12}$ are as defined above (e.g., 1,2-dimethyldisilane, 1,1,2,2-tetramethyldisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisilane). In certain embodiments, the organosilane/organosiloxane is a cyclic alkylsilane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate, di-tert-butoxydiacetoxysilane, methyltriacetoxysilane, dimethyldiacetoxysilane, and methyltriethoxysilane.

In other preferred embodiments of the present invention, the silicon-containing fluid can comprise a fluorine-providing silica precursor gas. Preferred fluorine-providing precursor gases for a CVD-deposited film comprise F—C bonds (i.e., fluorine bonded to carbon). Exemplary fluorine-providing gases include, e.g., organofluorosilanes such as, for example, alkylsilanes, alkoxysilanes, linear and cyclic organosiloxanes, linear and cyclic organosilane oligomers, cyclic or bridged organosilanes, and organosilanes with reactive side groups, provided that a fluorine atom is substituted for at least one of the species covalently bonded to silicon such that there is at least one Si—F bond. More specifically, suitable fluorine-providing gases include, e.g., fluorotrimethylsilane, difluorodimethylsilane, methyltrifluorosilane, flurotriethoxysilane, 1,2-difluoro-1,1,2,2,-tetramethyldisilane, or difluorodimethoxysilane.

The duration of the contacting step can vary depending on the time required to achieve equilibrium between the at least one silicon-containing fluid and the surfaces of the material. For spin-on processes, the duration of the contact step is preferably from 5 seconds to 30 minutes, and more preferably from 5 seconds to 300 seconds. For CVD methods, the duration of the contact step is preferably from 5 seconds to 4 hours, and more preferably from 5 seconds to 1 hour.

The method of the present invention optionally includes the step of removing a first portion of the silicon-containing fluid such that a second portion of the silicon-containing fluid remains in contact with the at least one surface of the layer of silicon-containing dielectric material. As used herein, the phrase "a first portion of the silicon-containing fluid such that a second portion of the silicon-containing fluid remains in contact with the at least one surface of the layer of silicon-containing dielectric material" as it refers to the removing step of the present invention means that the bulk of the silicon-containing fluid (i.e., the first portion) is removed from the surface of the film (i.e., the layer of dielectric material), including the trenches and vias; however, the removal of the silicon-containing fluid is not complete such that an amount of silicon-containing fluid (i.e., the second portion) remains absorbed and/or adsorbed or otherwise remains in contact with the layer of dielectric material such that an organosilane moiety such as, for example, a methyl group bonded to silicon, can react with or replace a hydroxyl group bound to a silicon atom upon exposure to an energy source according to the present invention. Excess material will undesirably lead to an additional layer of film formation upon exposure to such energy source. The removing step can be performed by any means known to those of ordinary skill in the art and will depend upon the method employed for the contacting step. For example, if the silicon-containing fluid is gaseous and the contacting step is by a CVD method, the chamber, which is typically equipped with one or more valves, can be exhausted. If, for example, the silicon-containing fluid is liquid and the contacting step is by a spin-on method, the excess fluid can be spun-off and the film dried. This could also mean using a rinse solvent, using super critical fluids, heat, evaporative techniques.

At a point after the layer of silicon-containing dielectric material is contacted with the silicon-containing fluid, the method of the present invention includes the step of exposing the at least one surface of the layer of silicon-containing dielectric material to an energy source, wherein the layer of silicon-containing dielectric material has a third dielectric constant that is lower than the second dielectric constant after exposing the layer of silicon-containing dielectric material to the energy source. The third dielectric constant may be between the first and second dielectric constant, equivalent to the first dielectric constant or lower than the first dielectric constant. Without intending to be bound by a particular theory, it is believed that the exposing step activates the fluid and/or the dielectric material to induce a chemical reaction to replace the hydroxyl groups bound to silicon atoms with hydrophobic carbon-containing groups such as, for example, methyl groups covalently bonded to silicon, which leads to the stability of the restoration process. Suitable energy sources include is at least one selected from the group consisting of α-particles, β-particles, γ-rays, x-rays, high energy electron, electron beam ("e-beam"), ultraviolet (UV) radiation (wavelengths from 10 nm to 400 nm), visible light (wavelengths from 400 to 750 nm), heat, hot filament, infrared light (wavelengths from 750 to $10^5$ nm), microwave (frequency >$10^9$ Hz), radio-frequency wavelengths (frequency>$10^6$ Hz), or mixtures thereof. Preferably, the energy source employed in the exposing step is selected from the group consisting of: UV radiation, heat, and an electron beam, and mixtures thereof. UV radiation alone and UV radiation in combination with heat are the most preferred energy sources.

When the energy source is UV radiation, the temperature of the substrate (and the at least one layer of dielectric material) is preferably from about 25° C. to about 500° C., more preferably from about 25° C. to about 425° C., and still more preferably from about 100° C. to about 400° C. The layer of silicon-containing dielectric material whose at least on surface is in contact with the silicon-containing fluid may be exposed to one or more wavelengths within the ultraviolet spectrum or one or more wavelengths within the ultraviolet spectrum such as deep ultraviolet light (i.e., wavelengths of 280 nm or below) or vacuum ultraviolet radiation (i.e., wavelengths of 200 nm or below). The ultraviolet radiation may be dispersive, focused, continuous wave, pulsed, scanning, or shuttered. Sources for the ultraviolet radiation include, but are not limited to, broad band sources (500 to 150 nm), dual frequency sources, e.g. combination of two monochromatic sources, an excimer laser, $CO_2$ laser, a barrier discharge lamp, a mercury lamp, a microwave-generated UV lamp, a laser such as a frequency doubled or frequency tripled laser in the IR or visible region, or a two-photon absorption from a laser in the visible region.

In certain embodiments, the ultraviolet radiation source is passed through optics to control the environment to which the sample is exposed. By controlling the environment in the chamber, the temperature of the substrate can be kept relatively low during the exposing step by adjusting the ultraviolet light to a particular wavelength.

In preferred embodiments, the exposure step is conducted in a non-oxidizing atmosphere such as an inert atmosphere (e.g., nitrogen, helium, argon, etc.), a reducing atmosphere (e.g., $H_2$, CO), or vacuum. Specific temperature and time durations for the exposure step may vary depending upon the chemical species used to restore the film's dielectric constant. The exposure step can be conducted for a time of about 60 minutes or less, preferably about 10 minutes or less, and more preferably for about 1 minute or less. The exposing step can occur in the same vessel/apparatus as the contacting step or a different vessel.

After the contacting and exposing steps, the layer of silicon-containing dielectric material has a third dielectric constant that is restored to a value that is lower than the second dielectric constant after exposing the at least one layer of silicon-containing dielectric material to the energy source. Preferably, the third dielectric constant is restored to a value that is anywhere from about 10% to about 150% restored relative to the second dielectric constant. In some embodiments of the present invention, the layer of dielectric material has a third dielectric constant that is restored to a value that is between the first and second dielectric constants. As used herein, the phrase "restored" or "% restored" as it refers to the third dielectric constant refers to a value calculated by the following equation:

$$\% \text{ restored} = [(\text{second dielectric constant} - \text{third dielectric constant})/(\text{second dielectric constant} - \text{first dielectric constant})] \times 100$$

Thus, for example, if the first dielectric constant is 2.2, the second dielectric constant is 4.0, and the third dielectric constant is 2.7, then as calculated from the formula above, the third dielectric constant is 72% restored. Similarly, if the first dielectric constant is 2.2, the second dielectric constant is 4.0, and the third dielectric constant is 1.8, then as calculated from the formula above, the third dielectric constant is 122% restored.

In preferred embodiments of the present invention, carbon is re-introduced into the film on the at least one surface as $CH_3$—Si, rather than as C—C from an organic source (although a C—C bond may be present in small amounts relative to the $CH_3$—Si bonds). Accordingly, the amount of carbon is higher after the method of the present invention relative to the amount of carbon in the damaged films (i.e., films having the second dielectric constant) and the dielectric layers preferably exhibit a stable dielectric constant after the process of the present invention. As shown in the Examples below, the stability of the dielectric constant after the restoration process of the present invention is evident after the layer having a restored dielectric constant (i.e., the dielectric layer having a third dielectric constant, herein also referred to as the restored layer) is thermally cycled. As used herein, the term "thermally cycled" refers to subsequent exposure of the restored layer to temperatures of from about 50° C. to 450° C. at least once and typically more than once, which are the conditions that such layers typically experience during the integration process. In preferred embodiments of the present invention, the layer of silicon-containing dielectric material has a dielectric constant that is within 10% of the third dielectric constant after exposure to a temperature of at least 400° C.

In certain embodiments of the present invention, after the removing step, an optional low-energy plasma energy source such as that employed in, for example, a PECVD apparatus, is used in combination with the exposure step described above. In these embodiments, the plasma energy applied may range from about 10 to about 200 watts/cm$^2$, more preferably about 10 to about 100 watts/cm$^2$. Preferably, the optional plasma energy step is performed after the removing step and either before or concurrently with the exposing step. As used herein the term "concurrent" or "concurrently" refers to the exposure of the at least one layer of dielectric material to the at least one energy source and the plasma energy at the same time for at least a portion of the exposure time. The duration of the concurrent exposure according to the present invention can be however brief or long as may be required by the particular application.

Although the method of the present invention can be employed to plug, fill-in, densify, or block access to inner portions of a porous material, in preferred embodiments, the method of the present invention does not block, plug, fill in, or seal pores, when present, nor does it form additional layers on the at least one layer of dielectric material.

The method of the present invention optionally includes the step of subjecting the at least one layer of dielectric material to a thermal treatment. In this step, the material is preferably subjected to a temperature of about 25° C. to about 450° C., and more preferably from about 25° C. to about 400° C. This step may occur during, prior to, and or after the exposing step.

In addition to the dielectric constant, the method of the present invention also restores material properties of the dielectric material such as, for example, breakdown voltage, leakage current, hydrophobicity, mechanical strength, carbon content, diffusion resistance, adhesion, modification of pore size, and hermeticity.

It will be appreciated that the invention is also contemplated to encompass methods of imparting a hydrophobic surface to silicon-containing, e.g., silica-containing, dielectric films, porous and/or nonporous, whether damaged or not, by application of the above-described plasma surface treatments. Microelectronic devices, such as semiconductor devices or ICs manufactured using these methods are also a part of the present invention.

The microelectronic devices, dielectric layers and materials may be utilized or incorporated into any suitable electronic component. Electronic components, as contemplated herein, are generally thought to comprise any dielectric component or layered dielectric component that can be utilized in an electronic-based product. Contemplated electronic components comprise circuit boards, integrated circuits, computer chips, memory devices, displays, photovoltaics, three-dimensional integration packaging, chip packaging, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, solar cells, portable memory devices, and a remote control. Also contemplated are "intermediate" products such as circuit boards, chip packaging, and keyboards that are potentially utilized in finished products.

Electronic products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested. Electronic products and components may comprise layered materials, layered components, and components that are laminated in preparation for use in the component or product.

Additional objects, advantages, and novel features of this invention will become apparent to those skilled in the art upon examination of the following examples thereof, which are not intended to be limiting.

EXAMPLES

Although the method of the present invention can be performed on any dielectric film, the following examples employ PDEMS™ 2.5 ATRP films. As used herein, the designation "PDEMS™ 2.5 ATRP film" refers to a film having a dielectric constant of about 2.5 prepared by the plasma enhanced chemical vapor deposition of a DEMS™ (diethoxymethylsilane) precursor and the porogen precursor ATRP (alpha-terpinene). The PDEMS™ 2.5 ATRP films were prepared according to the process disclosed in U.S. Pat. No. 6,846,515, which is incorporated herein by reference in its entirety.

Example 1

UV Curing (Gas Phase)

A PDEMS™ 2.5 ATRP film (CVD dielectric film prepared from DEMS™ and porogen) was damaged in etch, ash, and wet clean processes to remove carbon from the film causing the dielectric constant of the film to rise from 2.57 (first dielectric constant) to 2.87 (second dielectric constant) (film thickness 2791 A, RI=1.385). The sample was taken into a first vacuum chamber at 400° C. and vacuum for 5 minutes. After cooling the wafer, the wafer was transferred to a second vacuum chamber at 45 C. The chamber was pressurized to 12 torr with diethoxymethylsilane (no carrier). The sample was allowed to equilibrate for 2-3 minutes with the chemical vapor to aid in the diffusion of the chemistry into the pore system. The wafer was then transferred to a third vacuum chamber at 300° C. equipped with a sweeping broad band UV source (Fusion I-600 Lamp with H$^+$ bulb). The sample was exposed to the UV radiation for 1 minute. The sample was removed from the chamber. The dielectric constant of the film decreased to 2.61 (third dielectric constant) (film thickness 2758 A, RI=1.367). It appears that the same precursors that can be used for the deposition of PE-CVD films, e.g., DEMS™, can be adsorbed into the film and then UV cured to activate the DEMS™ molecule to interact with defects in the PDEMS™ network introduced by integration processing.

Example 2

UV Curing (Liquid Phase)

10 wt % solution of heptamethyldisilazane in 2-hexanone was mixed in a polypropylene bottle. A PDEMS™ 2.5 ATRP film (CVD dielectric film prepared from DEMS™ and porogen) was damaged in etch, ash, and wet clean processes to remove carbon from the film causing the dielectric constant of the film to rise from 2.53 (first dielectric constant) to 2.8 (second dielectric constant) (film thickness 3322 A, RI=1.338). A piece of this film was placed onto a spin coater. Approximately 3 mls of solution was placed on the film. The chemistry remained in contact with the film for 90 seconds before the restoration chemistry was removed via spin drying. The sample was moved to a vacuum chamber at 300 C equipped with a sweeping broad band UV source. The sample was exposed to 100% power UV light for 1 minute. After treatment the dielectric constant of the film was 2.46 (third dielectric constant) (film thickness 3215 A, RI=1.346). This example shows that the choice of chemistry, e.g., a silazane, is effective at restoring the dielectric constant of the film to 100%. The combination of examples 1 and 2 illustrates that the UV process enables both gas and liquid phase processes for restoring dielectric properties.

Example 3

Plasma Processing

A PDEMS™ 2.5 ATRP film (CVD dielectric film prepared from DEMS™ and porogen) was damaged in etch, ash, and wet clean processes to remove carbon from the film causing the dielectric constant of the film to rise from 2.57 (first dielectric constant) to 2.87 (second dielectric constant) (film thickness 2791 A, RI=1.385). The sample was taken into a first vacuum chamber at 400° C. and vacuum for 5 minutes. After cooling the wafer, the wafer was transferred to a second vacuum chamber at 45° C. The chamber was pressurized to 15 torr with diethoxymethylsilane (no carrier). The sample was allowed to equilibrate for 2-3 minutes with the chemical vapor to aid in the diffusion of the chemistry into the pore system. The diethoxymethylsilane was pumped out of the chamber and a flow of 200 mg/min of diethoxymethylsilane was started. Once flow had stabilized, a plasma (75 watts) was struck for 10 seconds. At the completion of the plasma step the chamber was pumped down and the sample removed. The dielectric constant of the film decreased to 2.8 (third dielectric constant) (film thickness 2820 A, RI=1.386). Plasma processes are also able to activate chemical species but the activated chemical species from a plasma process is not able to restore the dielectric constant of a damaged porous film.

Example 4

Plasma+UV (Gas Phase)

A PDEMS 2.5 ATRP film (CVD dielectric film prepared from DEMS and porogen) was damaged in etch, ash, and wet clean processes to remove carbon from the film causing the dielectric constant of the film to rise from 2.57 (first dielectric constant) to 2.87 (second dielectric constant) (film thickness 2791 A, RI=1.385). The sample was taken into a first vacuum chamber at 400° C. and vacuum for 5 minutes. After cooling the wafer, the wafer was transferred to a second vacuum chamber at 250° C. The chamber was pressurized to 18 torr with diethoxymethylsilane (no carrier). The sample was allowed to equilibrate for 2-3 minutes with the chemical vapor to aid in the diffusion of the chemistry into the pore system. The diethoxymethylsilane was pumped out of the chamber and a flow of 200 mg/min of diethoxymethylsilane was started. Once flow had stabilized, a plasma (75 watts) was struck for 10 seconds. At the completion of the plasma step the chamber was pumped down. The sample was moved to a third vacuum chamber at 300° C. equipped with a sweeping broad band UV source. The sample was exposed to 100% power UV light for 1 minute. The sample was removed from the chamber. The dielectric constant of the film decreased to 2.63 (third dielectric constant) (film thickness 2790 A, RI=1.368). Using the combination of chemically activated processes from a plasma process and curing using UV light it is possible to fully restore the dielectric constant of a film. Without the combination of the two processes it is not possible to fully recover the initial, undamaged film properties.

Example 5

Concentration of Silylating Agent in Solvent and Effect on the Dielectric Constant Recovery Since the application of the silicon-containing fluid may be in contact with either blanket films or patterned features, a device manufacturer may not want to use rinse steps after the silica containing fluid is applied. In typical wet chemical cleaning of patterned features the substrates are rinsed with copious amounts of water to remove any residual chemistry and/or debris from the etch and ash processes that is left on the wafer. To reduce the cost of ownership of a new process the elimination of any processing step will save money and potential for contamination. If one could optimize the concentration of the silylating agent in the silicon-containing fluid it may be possible to eliminate a process rinse step. This example is not meant to determine the upper limits, because it is assumed that concentrations higher than those below in Table 1 would also be beneficial for incorporating $CH_3$—Si bonds and recovering the dielectric constant.

The PDEMS™ 2.5 ATRP films were damaged using an oxidative ashing process. As with many of the other processes, this process typically results in higher or equivalent refractive index, removal of carbon from the film, and an increase in the dielectric constant of the film. In Table 1, "Undamaged" refers to the PDEMS™ 2.5 film after UV cure to remove the porogen but prior to any additional processing (i.e., the first dielectric constant) and "Damaged" refers to films damaged by an ash process (i.e., the second dielectric constant).

Several different compositions are shown in Table 1. The compositions were made by mixing the methyltriacetoxysilane (MTAS) with 2-pentanone, shaking, and allowing it to equilibrate for a minimum of 30 minutes. For example, 1 wt % MTAS in 2-pentanone is prepared by mixing 0.2 grams of MTAS with 19.8 grams of 2-pentanone in a Teflon or polypropylene bottle. The solutions were deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were then cured using of a broad-band UV source equipped with a H+ bulb. The UV cured samples were cured at 300° C. under vacuum for 1 minute. After curing, the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry.

As Table 1 demonstrates the concentration of the silylating chemistry for the acetoxysilanes does not seem to be extremely important for the recovery of the dielectric constant of the film, i.e., the third dielectric constant, but the amount of carbon that is re-introduced into film is related to the amount of chemistry that is introduced into the silica containing fluid. Likely, the amount of carbon that is introduced will aid in the chemical stability of the film, hydrophobicity of the film, and atmospheric stability of the film.

TABLE 1

| Film or wt % MTAS | Thickness (Å) | RI | K | CH₃Si peak area from FTIR | SiO peak area from FTIR |
|---|---|---|---|---|---|
| Undamaged | 5211 | 1.377 | 2.54 | 0.42 | 24.71 |
| Damaged | 5388 | — | 2.80 | 0.39 | 24.34 |
| 1 | 5178 | 1.362 | 2.61 | 0.51 | 27.19 |
| 0.5 | 5068 | 1.392 | 2.55 | 0.50 | 28.61 |
| 0.1 | 5467 | 1.333 | 2.59 | 0.46 | 26.17 |
| 0.05 | 5388 | 1.315 | 2.61 | 0.42 | 25.80 |

Example 6

UV Without Restoration Chemistry

A PDEMS™ 2.5 ATRP film (CVD dielectric film prepared from DEMS™ and porogen) was damaged in etch, ash, and wet clean processes to remove carbon from the film which caused the dielectric constant of the film to rise from 2.50 (first dielectric constant) to 2.99 (second dielectric constant) (film thickness 4468 A, RI=1.391). The sample was taken into a first vacuum chamber at 400° C. and vacuum for 5 minutes. After cooling the wafer, the wafer was transferred to a second vacuum chamber at 300° C. equipped with a sweeping broad band UV source. The sample was exposed to the UV light for 1 minute. The sample was removed and the dielectric constant decreased to 2.75 (third dielectric constant) (thickness 4539 A, RI=1.327). This example shows that UV light alone (i.e., without the chemistry) does not completely restore the dielectric constant of the film yet it is able to partially recover the dielectric constant of the film.

Example 7

Comparison of UV and Thermal Curing

This example looks at a variety of silylating agents as restoration agents and the effects of the curing process. The conditions for exposure were: either UV for 1 minute under vacuum at 300° C. or thermal (400° C.) for 5 minutes under flowing nitrogen.

The PDEMS™ 2.5 ATRP films were damaged through an oxidative ashing process after exposure to etch gases. As with many of the other processes, this process typically results in higher or equivalent refractive index, removal of carbon from the film, and an increase in the dielectric constant of the film. In Table 1, "Undamaged" refers to the PDEMS™ 2.5 film after UV cure to remove the porogen but prior to any additional processing (i.e., the first dielectric constant) and "Damaged" refers to films damaged by etch and ash processing (i.e., the second dielectric constant).

Several different compositions are shown in Table 2. The compositions were made by mixing the silylating agent with 2-pentanone, shaking, and allowing it to equilibrate for a minimum of 30 minutes. For example, 10 wt % aminopropyldimethylethoxy silane (APDMES) in 2-pentanone is prepared by mixing 2 grams of APDMES with 18 grams of 2-pentanone in a Teflon or polypropylene bottle. The solutions were deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were then cured thermally or by use of a broad-band UV source. The thermally cured samples were cured at 400° C. under nitrogen flow for 5-10 minutes; UV cured samples were cured at 300° C. under vacuum for 1 minute. After curing, the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry. Several of the repaired films were then thermally cycled from 50° C. to 450° C. under nitrogen flow (O₂ concentration less than 100 ppm) for a total of 7 times to evaluate the stability of the chemistry in the film.

TABLE 2

| Chemistry | K | RI | Cure | CH₃Si peak area from FTIR | SiO peak area from FTIR | Changes after thermal cycling |
|---|---|---|---|---|---|---|
| Undamaged | 2.53 | 1.341 | | 0.757 | 29.63 | |
| Damaged | 2.80 | 1.333 | | 0.628 | 26.84 | |
| 0.5% MTAS | 2.50 | 1.338 | UV | 0.646 | 28.84 | No change in k, RI, methyl content |
| | 2.71 | 1.346 | Thermal | 0.664 | 27.19 | |
| 10% APDMES | 2.51 | 1.396 | UV | 0.610 | 28.93 | |
| 10% DMDAS | 2.52 | 1.391 | UV | 0.561 | 28.93 | No change in k, RI, methyl content |
| | 2.92 | 1.391 | Thermal | 0.550 | 27.38 | |
| 10% MTES | 2.69 | 1.409 | UV | 0.561 | 29.76 | |
| | 2.90 | 1.405 | Thermal | 0.574 | 27.07 | |
| 10% HMDS | 2.74 | 1.415 | UV | 0.567 | 30.37 | Increased k value, small decrease in methyl content, no change in RI |
| | 2.87 | 1.403 | Thermal | 0.568 | 27.49 | |
| 10% OMCTS | 2.46 | 1.331 | UV | 0.643 | 28.56 | No change in k, RI, methyl content |
| 10% C7DSZ | 2.63 | 1.329 | UV | 0.634 | 28.58 | |
| | 2.7 | 1.322 | thermal | 0.623 | 27.42 | |
| 10% MESCP | 2.53 | 1.336 | UV | 0.637 | 28.83 | 5% lower k, no change in RI, methyl content |
| | 2.65 | 1.326 | thermal | 0.627 | 27.42 | |

MTAS = methyltriacetoxysilane;
APDMES = 3-aminopropyldimethylethoxysilane;
DMDAS = dimethyldiacetoxysilane;
MTES = methyltriethoxysilane;
HMDS = hexamethyldisilazane;
OMCTS = octamethyltetrasiloxane;
C7DSZ = heptamethyldisilazane;
MESCP = methylethoxysilacyclopentane Table 2 shows that UV radiation is more effective at restoring the films' dielectric constants over a wide variety of restoration chemistries. This example shows that the chemistry that is introduced and cured by UV light is extremely robust to multiple heat cycles. This suggests strongly that all of the chemical species introduced into the damaged film are covalently bonded to the network defects and will not degas upon additional processing steps.

Example 8

Repair of Damage After Ash Damage and Wet Chemical Stripper Exposure

During the repair of damaged porous dielectric silicon-containing thin films, it is preferable to repair the interlayer dielectric film after all processes employed to fabricate trenches and vias. Such processes include etching, ashing, and wet chemical stripping, all of which cause increases in the dielectric constant of the film and decreased hydrophobicity. The restoration chemistry preferably is also able to repair surfaces after exposure to water and alcohols, either liquids or vapors, used to dry the film after exposure to wet chemical strippers.

The PDEMS™ 2.5 ATRP films were damaged through an oxidative ashing process. After exposure to the oxidative ash process, the films were cleaned with a variety of wet chemical stripping products, washed with water, and IPA vapor dried. There was no heating between the wet chemical stripper and restoration chemistry deposition. As with many of the other processes used to make trenches and vias in the dielectric layers, this process typically results in higher or equivalent refractive index (RI), removal of carbon from the film, and an increase in the dielectric constant of the film. In Table 2, "Undamaged" refers to the PDEMS™ 2.5 film after UV cure but prior to any additional processing (i.e., the first dielectric constant).

Several different compositions are shown in Table 3. The solutions were made by mixing the silylating agent with 2-pentanone, shaking, and allowing it to equilibrate for a minimum of 30 minutes. For example, 1 wt % methyltriacetoxysilane (MTAS) in 2-pentanone was prepared by mixing 0.2 grams of MTAS with 19.8 grams of 2-pentanone in a Teflon or polypropylene bottle. The solutions were deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry. This example shows that the chemistry and process to restore the film is capable of being used with wet chemical fluoride-based residue strippers.

TABLE 3

| Clean Chemistry | Restoration Chemistry | k After Wet Chemical Clean | k After Restoration | Δ Change Between Restore and Clean |
|---|---|---|---|---|
| Undamaged | | | 2.57 | |
| EZStrip ™ 510 | 10% HMDS | 2.70 | 2.59 | −0.11 |
| EZStrip ™ 510 | 1% MTAS | 2.82 | 2.60 | −0.22 |
| EZStrip ™ 511 | 10% C7DSZ | 2.77 | 2.62 | −0.15 |
| EZStrip ™ 511 | 1% MTAS | 3.05 | 2.76 | −0.19 |
| EZStrip ™ 520 | 1% MTAS | 3.09 | 2.75 | −0.34 |
| Dilute HF | 1% MTAS | 2.82 | 2.65 | −0.17 |

MTAS = methyltriacetoxysilane;
HMDS = hexamethyldisilazane;
OMCTS = octamethyltetrasiloxane;
C7DSZ = heptamethyldisilazane;
EZStrip ™ Chemicals are available from Air Products and Chemicals, Inc., Allentown, Pennsylvania Example 9

Effect of Rinse Solvents on Restoration Chemistry

Restoration chemistry can be employed to repair side wall damage that occurs from etching and ashing. Such chemistries and processes will have to able to penetrate small features, penetrate the pore systems, restore the composition and electrical properties of the film, and minimize any changes in the critical dimensions of the features. Depending upon the reactivity of the molecules, rinse solvents may have to be used to remove residues from patterned features yet must not remove the chemistry from the active defects that the restoration chemistry is targeting.

The films employed in this example were patterned, etched, ashed, and wet cleaned so as to leave etched features in the dielectric film. After preparing the patterned substrate, restoration chemistry according to the present invention was applied to repair any sidewall damage that may have occurred during processing. The solutions were mixed in Teflon or polypropylene bottles on a wt/wt basis. For example, to prepare a 5% dimethyldiacetoxysilane (DMDAS) in 2-pentanone solution, 1 gram of DMDAS was added to 19 grams of 2-pentanone. The solutions were allowed to equilibrate for a minimum of 30 minutes prior to application. The solutions were deposited onto a damaged blanket PDEMS™ 2.5 ATRP and the patterned wafer for a time period of 5 seconds to 300 seconds after which the solution was removed by spin drying. The film was spun for 30 seconds at 300 rpm, 10 seconds at 500 rpm, and 60 seconds at 800 rpm. After spinning the sample was rinsed with a solvent, e.g., 2-pentanone or 1-pentanol, to remove any residuals from the film. The rinse step to remove residues from the patterned feature is optional and depends upon the type of restoration chemistry that is being used to repair the damaged regions of the film and the density of the features that are repaired. If the wafer is rinsed with the solvent the rinse is applied while the wafer is spinning at 500 rpm for 7-10 seconds and then dried at 1800 rpm for 40 seconds. The films were exposed to UV at 300° C. under vacuum for 1 minute. The blanket film was characterized by reflectometry, Hg probe, and FTIR. SEM was used to evaluate the cleanliness of the trenches in the patterned substrate. The penetration of the chemistry was evaluated by dipping the patterned feature into dilute hydrofluoric acid (HF) (100 water:1HF) for 20 seconds and then measuring the width of the trench using SEM before and after HF dip. If the chemistry penetrated the dielectric there will be minimal changes in the dimensions of the trench. The results for two acetoxy silanes are shown in Table 4. In Table 4, "Damaged film" refers to the film after exposure to the etch and ash processes (i.e., the second dielectric constant). This example shows that the use of a rinse solvent may be advantageous for preparing clean features and that the rinse solvent does not remove the chemistry from the surface of the film.

TABLE 4

| Restoration chemistry | Rinse solvent | Change in k relative to undamaged film | Are patterned features clean | % change in trench width after dilute HF dip |
|---|---|---|---|---|
| Damaged film (none) | None | 0.27 | Yes | Collapse of small features; 50% or larger changes in large features |
| 1% MTAS | None | 0.14 | no (filled features) | none |
| | 2-pentanone | 0.10 | Yes | 10% |
| | 1-pentanol | 0.08 | Yes | 10% |
| 5% DMDAS | None | 0.09 | Yes | 2% |
| | 2-pentanone | 0.13 | Yes | 2% |
| | 1-pentanol | 0.12 | Yes | 2% |

MTAS = methyltriacetoxysilane;
DMDAS = dimethyldiacetoxysilane

Example 10

Effects of Atmosphere on UV Cure and Effect of Temperature on Thermal Cure

Many UV curing chambers do not have vacuum capability, therefore the effect of atmospheric pressure vs. vacuum may be an important factor in successful restoration processes. As a comparison, thermal treatments are also conducted under inert purge at a variety of temperatures to see if the restoration chemistry is activated at any particular temperature.

The PDEMS™ 2.5 ATRP films were damaged through an oxidative ashing process after exposure to etch gases. As with many of the other processes, this process typically results in higher or equivalent refractive index, removal of carbon from the film, and an increase in the dielectric constant of the film. In Table 5, "Damaged" refers to films damaged by etch and ash processing prior to restoration chemistry and curing (i.e., the second dielectric constant).

A 2.5 wt % methyltriacetoxysilane (MTAS), 2.5 wt % dimethyldiacetoxysilane (DMDAS) in 2-pentanone was prepared by mixing 0.5 grams of MTAS, 0.5 grams of DMDAS with 19 grams of 2-pentanone in a Teflon or polypropylene bottle. The compositions were deposited onto the wafer for a time period of 5 seconds to 300 seconds after which the composition was removed by spin drying. The film was spun for 30 seconds at 300 rpm, 10 seconds at 500 rpm, and 60 seconds at 800 rpm. The films were cured by either of two methodologies: (1) UV cured at 300° C. for 1 minute under vacuum or 600 torr of He; and (2) thermally at 400° C. for 5 minutes under flowing nitrogen. After curing the samples were allowed to equilibrate in a clean room environment (40-45% RH, 72° F.) for 3 days to allow the film to re-adsorb water. Reflectometry, Hg probe, and FTIR were employed to evaluate the effectiveness of the restoration chemistry. The results are shown in Table 5. "Change in k" in Table 5 for the damaged film is the difference between the second dielectric constant and the first dielectric constant whereas the restored film cured by UV light or thermally refers to the difference between the third dielectric constant and the first dielectric constant. This example demonstrates that the higher temperature thermal cures are not able to recover the dielectric constant of the film.

TABLE 5

| Film | Cure | Temperature (° C.) | Atmosphere | Change in k |
| --- | --- | --- | --- | --- |
| Damaged | damaged by $O_2$ plasma | NA | NA | 0.51 |
| Restored | UV | 300 | Vacuum | 0.080 |
|  |  | 300 | Nitrogen | 0.155 |
| Restored | Thermal | 250 | Nitrogen | 0.305 |
|  |  | 350 | Nitrogen | 0.385 |
|  |  | 400 | Nitrogen | 0.345 |

Example 11

Effects of Restoration Chemistry on the Adhesion of Metal Barrier Films

Because the dielectric properties of dielectric films are damaged by many of the processes employed to make trenches and vias in integrated circuits, it is necessary to repair the damage incurred from these processes. When porous dielectric films are damaged, the surface becomes hydrophilic due to the loss of carbon species which greatly improves the adhesion of subsequent layers. After completing restoration chemistry, the surface is preferably more hydrophobic than the damaged film which may lead to problems with the adhesion of the metal barriers to the dielectric layer. Adhesion failure can cause voiding, copper penetration into the dielectric layer, and poor device reliability.

A common technique to measure the adhesion between different layers is the four point bending technique. The composite film that was used for this technique was $Si/H_2$ damaged PDEMS™ 2.5/TaN/Cu/epoxy/Si. The restoration fluids tested included 1 wt % MTAS in 2-pentanone followed by a 1-pentanol rinse, 10 wt % bis(dimethylamino)dimethylsilane (DMADMS) in 2-pentanone followed by a 1-pentanol rinse, and 10 wt % HMDS in 2 pentanone. Two $H_2$ damaged PDEMS™ films were restored directly with 1 wt % MTAS in 2-pentanone followed by a 1-pentanol rinse and 10 wt % HMDS in 2 pentanone. All of the films, except the film treated with 10 wt % HMDS, were UV cured at 300° C. for 1 minute under vacuum while the HMDS film was treated thermally at 400° C. for 30 minutes. Two different adhesion experiments were performed: one where the notch was placed into the Si wafer adjacent to the epoxy/Cu interface; the other experiment placed the notch on the Si wafer adjacent to the PDEMS™/TaN interface. The results in Table 6 are from the experiment where the notch was placed on the PDEMS™/TaN interface. As Table 6 indicates, the use of restoration chemistry does not appear to affect the adhesion of the metal barrier to the dielectric layer.

TABLE 6

| Film | Adhesion ($J/m^2$) |
| --- | --- |
| $H_2$ plasma damaged | 7.8 |
| 1 wt % MTAS, rinse, UV cure | 8.8 |
| 10 wt % HMDS, thermal cure | 9.5 |
| 87 F. treated, 1 wt % MTAS, rinse, UV cure | 8.3 |
| 87 F. treated, 10 wt % DMADMS, rinse, UV cure | 7.8 |

Example 12

Effect of UV Light

There are many different UV light sources that may be able to activate chemical restoration of films including broad band and monochromatic light sources. This example demonstrates that lower wavelengths, i.e., 185 nm and below, may be highly effective at restoring damaged films.

PDEMS™ 2.3 NBDE films were damaged by 60 seconds of an oxidative ashing process. The damaged films were exposed to 1 wt % MTAS in 2-hexanone prior to being cured. Table 7 clearly shows that both temperature and the wavelengths of light used are important to restoring damaged films. "Undamaged" film refers to the film prior to any damaging processes (i.e., the first dielectric constant), "Damaged" film refers to the film after being through an oxidative ash process for 60 seconds (i.e., the second dielectric constant), and the other four films are after restoration with 1 wt % MTAS and cured using the UV source and temperatures indicated for 1 minute. This example also shows that both broad band and monochromatic light sources are able to be used to cure films.

TABLE 7

| Film | Dielectric constant | Change in dielectric constant relative to the undamaged film |
| --- | --- | --- |
| Undamaged | 2.3 | 0.0 |
| Damaged | 2.6 | 0.3 |
| Broad band (300° C.) | 2.35 | 0.05 |
| Broad band (150° C.) | 2.48 | 0.18 |
| Monochromatic UV Radiation (300° C., vacuum) | 2.32 | 0.02 |

Example 13

Stability of the Chemistry on the Damaged Wafer Prior to UV Cure

Tool down time and processing issues may cause delays in curing the films, therefore there may be some variability in the effectiveness of the films as they are aged prior to curing.

The PDEMS™ 2.5 ATRP films were damaged through an oxidative ashing process. As with many of the other processes used to make trenches and vias in the dielectric layers, this process typically results in higher or equivalent refractive index, removal of carbon from the film, and an increase in the dielectric constant of the film. In Table 8, "Undamaged" refers to the PDEMS™ 2.5 film after UV cure but prior to any additional processing (i.e., the first dielectric constant) and "Damaged" refers to the film after oxidative plasma treatment (i.e., the second dielectric constant).

A composition comprising 2.5 wt % DMDAS and 2.5 wt % MTAS in 2-pentanone was prepared by mixing 0.5 grams of MTAS, 0.5 grams of DMDAS with 19 grams of 2-pentanone in a Teflon or polypropylene bottle. The composition was deposited onto the wafer for a time period of 5 seconds to 300 seconds after which the solution was removed by spin drying. The film was spun for 30 seconds at 300 rpm, 10 seconds at 500 rpm, and 60 seconds at 800 rpm. Several wafers were treated in the same manner and then allowed to age in a clean room environment (40-45% RH, 72° F.) for varying periods of time. After aging, the film was cured with UV light under vacuum for 1 minute at 300° C. The results are shown in Table 8. Table 8 shows that there is little change in the recovered dielectric constant of the film up to 10 days suggesting that the chemistry, once applied to the damaged surface, is quite stable and does not evaporate upon storage. Upon UV curing of the aged sample, it is possible to recover the dielectric constant of the film. This example shows that the chemistry being applied to the film before curing is quite stable, one week or longer under ambient conditions, and reacts with hydroxyl and hydride defects introduced by plasma processing.

TABLE 8

| Time (days) | Dielectric constant |
| --- | --- |
| 0 (Undamaged) | 2.58 |
| 0 (Damaged) | 2.84 |
| 0.3 hours | 2.62 |
| 1 | 2.66 |
| 3 | 2.63 |
| 10 | 2.67 |

Example 14

Dielectric Constant Stability Upon Storage After Repair

Once the films have been repaired there may be extended periods of time before the films are further processed. The restored film preferably remains electrically and compositionally stable for as long as possible under clean room conditions. If the film remains stable, it suggests that the chemistry is chemically bound to the defects within the film, the film is highly hydrophobic, and that atmospheric moisture doesn't interact strongly with the repaired surfaces.

Several different compositions are shown in Table 8. The "Undamaged" film in Table 8 refers to an Aurora™ 2.5 film that has not been exposed to subsequent processing and the "Damaged" film refers to an Aurora™ 2.5 film that has been exposed to an $O_2/Cl_2$ plasma. These types of etch gases are usually used with metal hard masks schemes in order to etch through the metal that is protecting the underlying layers. $O_2/Cl_2$ etch gases are highly reactive and can create both chloro and hydroxyl groups on the surface of the film and may penetrate the wall structures more deeply than standard fluorocarbon etch gases. The solutions in Table 8 were made by mixing the silylating agent with 2-pentanone, shaking, and allowing it to equilibrate for a minimum of 30 minutes. For example, 10 wt % bis(dimethylamino)dimethylsilane (DMADMS) in 2-pentanone was prepared by mixing 2 grams of DMADMS with 18 g of 2-pentanone in a Teflon or polypropylene bottle. The solutions were deposited onto the wafers for a time period of 5 seconds to 300 seconds after which the solution was removed by spin drying. The film was spun for 30 seconds at 300 rpm, 10 seconds at 500 rpm, and 60 seconds at 800 rpm. The film was cured by exposing the film to UV light under vacuum at 300° C. for 1 minute. After curing, the samples were allowed to equilibrate in a clean room environment (40-45% RH, 72° F.) for 3 days to allow the film to re-adsorb water. Measurements were then re-taken after 30 days to look at the effects of storage stability of the films. Reflectometry, Hg probe, and FTIR were used to evaluate the effectiveness of the restoration chemistry. As Table 9 shows, the use of silylating agents and UV light result in stable films, capacitance and composition from FTIR, for as long as 30 days under 45% RH and 72° F. conditions.

TABLE 9

| Chemistry | initial k value | k value after 3 days | k value after 30 days | $CH_3Si$ peak area from FTIR | SiO peak area from FTIR |
| --- | --- | --- | --- | --- | --- |
| Undamaged | 2.64 | | | 0.611 | 28.02 |
| Damaged | 5.4 | | | 0.328 | 28.88 |
| 1% MTAS | | 2.98 | 2.89 | 0.477 | 36.34 |
| 10% DMADMS | | 3.31 | 3.35 | 0.407 | 34.42 |
| 10% HMCTS | | 3.50 | 3.36 | 0.376 | 34.00 |
| DMCSZ | | 3.13 | 3.18 | 0.420 | 34.22 |
| 5% ATMS | | 3.5 | 3.14 | 0.358 | 34.37 |
| 5% DMDAS | | 3.58 | 3.65 | 0.383 | 34.61 |

The chemistry after it is applied and cured is stable for at least 1 month under ambient conditions. This suggests that the surface is highly hydrophobic and that many of the plasma induced defects have been removed either through chemical reaction with the restoration fluid or condensation of nearby framework defects. It appears that the restoration process using UV light is a two fold process; first the chemistry reacts with any available defects to create Si—O—Si linkages terminated in organic functionality and; second the UV light removes any material that is not bonded to the silicate network and causes further condensation reactions to occur between any residual defects with itself, i.e., Si—OH+HO—Si=Si—O—Si+water, or a hydrophobic moiety that has not been fully cross-linked.

Example 15

Leakage Current and Breakdown Voltage

The PDEMS™ 2.5 ATRP films were damaged through an oxidative ashing process after exposure to etch gases. As with many of the other processes, this process typically resulted in higher or equivalent refractive index, removal of carbon from the film, and an increase in the dielectric constant of the film. In Table 10, "Undamaged" refers to the PDEMS™ 2.5 film after UV cure but prior to any additional processing (i.e., the first dielectric constant) and "Damaged" refers to films damaged by etch and ash processing (i.e., the second dielectric constant).

Several different mixtures are shown in Table 10. The solutions were made by mixing the silylating agent with 2-hexanone, shaking, and allowing it to equilibrate for a minimum of 30 minutes. For example, 2.5 wt % aminopropyldimethylethoxysilane (APDMES) and 2.5 wt % methyltriacetoxysilane (MTAS) in 2-hexanone was prepared by mixing 1 gram of APDMES and 1 gram of MTAS with 18 g of 2-pentanone in a Teflon or polypropylene bottle. The solution was deposited onto the wafer for a time period of 5 seconds to 300 seconds afterwhich the solution is removed by spin drying. The film is spun for 30 seconds at 300 rpm, 10 seconds at 500 rpm, and 60 seconds at 800 rpm. For comparison, films were cured thermally and, separately, with a broad band UV source. The thermally cured samples were cured at 400° C. under nitrogen flow for 5-10 minutes; UV cured samples were cured at 300° C. under vacuum for 1 minute. After curing the samples were allowed to equilibrate in a clean room environment (40-45% RH, 72° F.) for 3 days to allow the film to re-adsorb water. Hg probe and reflectometry were used to evaluate the dielectric recovery as calculated from the above equation defining "% restored", leakage current density, and breakdown voltage. The films were not re-heated to remove any adsorbed water prior to the electrical measurements. Contact angle is the contact angle of a water droplet with the film surface.

Table 10 shows that a thermally cured film is able to recover the capacitance of the film but not the leakage current density and breakdown voltage. It appears that thermally curing the film does not fully crosslink the film and does not remove species that may be physisorbed in the film. On the otherhand, UV curing coupled with the choice of chemistry is crucial to repairing the electrical properties of the film.

TABLE 10

| Chemistry/Film | Cure | Dielectric recovery (%) | Leakage Current Density (A/cm$^2$) | Breakdown Voltage (MV/cm) | Water contact angle (degrees) |
|---|---|---|---|---|---|
| Undamaged | | N/A | $9.9 \times 10^{-12}$ | 8.8 | 88 |
| Damaged (Plasma) | | 0 | $2.1 \times 10^{-7}$ | 0.6 | 45 |
| 10% OMCTS | Thermal | 104 | $2.8 \times 10^{-5}$ | 0.6 | 92 |
| 10% OMCTS | UV | 74 | $4.1 \times 10^{-11}$ | 8.5 | 90 |
| 2.5% APDMES/ 2.5% MTAS | UV | 89 | $5.5 \times 10^{-11}$ | 6.8 | — |
| 1% MTAS | UV | 126 | $6.6 \times 10^{-11}$ | 8.0 | 95 |
| 10% DMDAS | UV | 114 | $1.1 \times 10^{-11}$ | 1.5 | — |
| 2.5% MTAS/2.5% DMDAS | UV | 71 | $3.8 \times 10^{-11}$ | 4.7 | — |
| 10% C7DSZ | UV | 126 | $4.1 \times 10^{-11}$ | 4.9 | — |

OMCTS = octamethylcyclotetrasiloxane;
APDMES = 3-aminopropyldimethylethoxysilane;
MTAS = methyltriacetoxysilane;
DMDAS = dimethyldiacetoxysilane;
C7DSZ = heptamethyldisilazane Comparative Example 1:

This example compares the use of the toughening agent active component, DMDAS, disclosed in US 2006/0057855, an acetoxy silane, in the gas phase in a plasma, with UV exposure, and plasma versus UV exposure.

The blanket films used in the study were PDEMS™ 2.5 ATRP films damaged with an oxygen plasma. The films were exposed to an oxygen plasma for 20 seconds (100% $O_2$, 100 sccm, 300 mTorr) to damage the films as typically observed in ashing processes. The refractive index, dielectric constant, and $CH_3$—Si and SiO integrated peak areas of the FTIR of the undamaged blanket film, i.e. the first dielectric constant, and a blanket film treated in an oxygen plasma are shown in Table 11. There was a change in the dielectric constant after oxygen plasma treatment of 0.43, i.e. the difference between the second dielectric constant and the first dielectric constant, an increase in the refractive index of the film, and a decrease in the methyl content of the film.

Four other films are also shown in Table 11. These examples are different activated chemical treatments use dimethyldiacetoxysilane (DMDAS) as the active chemical restoration agent. The films were placed into a P5000 first vacuum chamber and dehydrated under vacuum at 400° C. for 5 minutes. The wafer was then moved to a second vacuum chamber with the susceptor temperature set at 250° C. After transferring the wafer to the second chamber, the DMDAS was introduced into the chamber as a vapor. The chamber was charged to the pressure noted in Table 11. The sample was equilibrated at 250° C. in the presence of DMDAS for 5 minutes. In the case of exposure to the plasma, the chemical flow was re-established and a plasma struck at 100 watts for 10 seconds. After the initial chemical exposure or a DMDAS plasma, the chamber was pumped down. The wafer was transferred to a third vacuum chamber equipped with a broad band Fusion UV system. The susceptor in the UV chamber was set to 300° C. The samples were then exposed to the UV light for 1 minute. After exposure to the UV source, the samples were removed from the chamber and placed back into the cassette.

After allowing the wafers to equilibrate in a class 100 clean room at 72° F. and 42% R.H. for one day, the dielectric constant, i.e. the third dielectric constant, refractive index, and carbon content of the films were re-measured. The results are tabulated in Table 11. Delta k values close to zero indicate that the dielectric constant is similar to the undamaged PDEMS™ 2.5 ATRP film. Increases in the carbon content of the film are indicated by an increase in the $CH_3$—Si peak area. While not intending to be bound by any particular theory, the increase in the SiO peak area in the FTIR is likely due to the repair of defects from the interaction of the restoration chemistry with the hydroxyl and hydride defects as well as additional condensation of hydroxyls and hydrides with themselves caused by their interaction with UV light.

TABLE 11

| Example | Type | DMDAS pressure (torr) | Chamber Temp (° C.) | Δk | RI | $CH_3Si$ peak area from FTIR | SiO peak area from FTIR |
|---|---|---|---|---|---|---|---|
| Undamaged | | NA | NA | 0.00 | 1.3709 | 0.44 | 23.31 |
| Damaged | | NA | NA | 0.43 | 1.3909 | 0.40 | 23.645 |
| Restoration 1 | Plasma | 3.2 | 250 | 0.48 | 1.3383 | 0.40 | 23.40 |
| Restoration 2 | Plasma + UV | 1.8 | 250 | 0.045 | 1.3353 | 0.45 | 27.26 |
| Restoration 3 | UV | 2.5 | 250 | 0.065 | 1.3363 | 0.45 | 27.48 |
| Restoration 4 | UV (no DMDAS) | NA | NA | 0.25 | 1.3270 | 0.39 | 23.60 |

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

We claim:

1. A method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of:
   contacting the at least one surface of the layer of silicon-containing dielectric material with a silicon-containing fluid; and
   exposing the at least one surface of the layer of silicon-containing dielectric material to an energy source selected from the group consisting of: UV radiation, heat, and an electron beam, wherein the layer of silicon-containing dielectric material has a third dielectric constant that is lower than the second dielectric constant after exposing the layer of silicon-containing dielectric material to the energy source.

2. The method of claim 1 further comprising the step of removing a first portion of the silicon-containing fluid such that a second portion of the silicon-containing fluid remains in contact with the at least one surface of the layer of silicon-containing dielectric material, wherein the removing step occurs between the contacting step and the exposing step.

3. The method of claim 1 further comprising the step of exposing the layer of silicon-containing dielectric material to a low-energy plasma source prior to exposing the layer of silicon-containing dielectric material to the energy source.

4. The method of claim 3 wherein the layer of silicon-containing dielectric material is exposed concurrently to the plasma energy source and at least one energy source selected from the group consisting of: UV radiation, thermal energy, and an electron beam.

5. The method of claim 3 wherein the layer of silicon-containing dielectric material is exposed to the plasma energy source before it is exposed to the at least one energy source selected from the group consisting of: UV radiation, thermal energy, and an electron beam.

6. The method of claim 1 wherein the energy source comprises UV radiation.

7. The method of claim 6 wherein the energy source further includes thermal energy.

8. The method of claim 6 wherein the UV radiation is monochromatic UV radiation.

9. The method of claim 1 wherein the contacting step is performed by a chemical vapor deposition process.

10. The method of claim 9 wherein the silicon-containing fluid is at least one selected from the group consisting of: methyltrimethoxysilane, methyltriethoxysilane, methyltri-n-propoxysilane, methyltriisopropoxysilane, ethyltrimethoxysilane, ethyltriethoxysilane, dimethyldimethoxysilane, dimethyldiethoxysilane, diethyldimethoxysilane, diethyldiethoxysilane, diethoxymethylsilane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, 2,2,4,6,6-pentamethyl-2,4,6-trisilaheptane, 1,methyl-1-ethoxy-silacyclopentane, 1,1,3,3-tetramethyl-1,3-disilacyclobutane, 1,3-dimethyl-1,3-diethoxy-1,3-disilacyclobutane, bis(trimethylsilylmethyl)benzene, (tridecafluoro-1,1,2,2-tetrahydrooctyl)triethoxysilane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, hexamethyldisilazane, hexamethylcyclotrisilazane, heptamethyldisialzane, octamethylcyclotetrasilazane, nonamethyltrisilazane, dimethylcyclosilazane, acetoxytrimethylsilane, methoxytrimethylsilane, ethoxytrimethylsilane, 3-aminopropyldimethylethoxysilane, 3-aminopropylmethyldiethoxysilane, bis(dimethylamino)dimethylsilane, dimethylaminotrimethylsilane, aminomethyltrimethylsilane, octamethylcyclotetrasiloxane, tetramethylcyclotetrasiloxane, methyltriacetoxysilane, methylethoxysilacyclopropane, hexamethylsilabutane, dimethyldiacetoxysilane, and di-tert-butoxydiacetoxysilane.

11. The method of claim 10 wherein the silicon-containing fluid is at least one selected from the group consisting of: hexamethyldisilazane, hexamethylcyclotrisilazane, heptamethyldisilazane, octamethylcyclotetrasilazane, nonamethyltrisilazane, dimethylcyclosilazane, acetoxytrimethylsilane, methoxytrimethylsilane, ethoxytrimethylsilane, 3-aminopropyldimethylethoxysilane, 3-aminopropylmethyldiethoxysilane, bis(dimethylamino)dimethylsilane, dimethylaminotrimethylsilane, aminomethyltrimethylsilane, octamethylcyclotetrasiloxane, tetramethylcyclotetrasiloxane, hexamethylcyclotrisiloxane, decamethylcyclopentasilane, dodecamethylcyclohexasilane, 2,2,4,6,6-pentamethyl-2,4,6-trisila-heptane, 1,methyl-1-ethoxy-silacyclopentane, 1,1,3,3-tetramethyl-1,3-disilacyclobutane, 1,3-dimethyl-1,3-diethoxy-1,3-disilacyclobutane, bis(trimethylsilylmethyl) benzene, dimethydimethoxysilane, dimethyldiethoxysilane, methyltriethoxysilane, methyltrimethoxysilane, and (tridecafluoro-1,1,2,2-tetrahydrooctyl)triethoxysilane.

12. The method of claim 11 wherein the silicon-containing fluid is at least one selected from the group consisting of: diethoxymethylsilane, dimethyldiacetoxysilane, methyltriacetoxysilane, di-tert-butoxydiacetoxysilane, dimethyldimethoxysilane, and methyltriethoxysilane.

13. The method of claim 10 wherein the silicon-containing fluid comprises at least one of octamethylcyclotetrasiloxane and tetramethylcyclotetrasiloxane.

14. The method of claim 12 wherein the silicon-containing fluid comprises dimethyldiacetoxysilane, methyltriacetoxysilane, and acetoxytrimethylsilane.

15. The method of claim 1 wherein the contacting step is performed by a spin-on deposition process.

16. The method of claim 1 wherein the layer of silicon-containing dielectric material is porous.

17. The method of claim 1 wherein the first dielectric constant is from about 1.5 to about 3.5, the second dielectric constant is from about 5% to about 200% higher than the first dielectric constant and the third dielectric constant is from about 10% to about 150% restored relative to the second dielectric constant.

18. The method of claim 17 wherein the first dielectric constant is from about 1.5 to about 2.8.

19. The method of claim 18 wherein the first dielectric constant is from about 1.8 to about 2.7.

20. The method of claim 1 wherein the layer of silicon-containing dielectric material has a dielectric constant that is within 10% of the third dielectric constant after exposure to a temperature of at least 400° C.

21. The method of claim 1 wherein the silicon-containing fluid comprises at least one selected from the group consisting of: a linear silazane, a cyclic silazane, a cyclic organosiloxane, an organosilane, an alkylalkoxysilane, an alkylacetoxysilane, an alkylchlorosilane, a carbosilane, an aminoalkylsilane, an alkylaminoalkylsilane, and an aminoalkylalkoxysilane.

22. The method of claim 21 wherein the silicon-containing fluid comprises an alkylacetoxysilane.

23. A method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of:
  contacting the at least one surface of the layer of silicon-containing dielectric material with a silicon-containing fluid;
  removing a first portion of the silicon-containing fluid such that a second portion of the silicon-containing fluid remains in contact with the at least one surface of the layer of silicon-containing dielectric material; and
  exposing the at least one surface of the layer of silicon-containing dielectric material to UV radiation and thermal energy, wherein the layer of silicon-containing dielectric material has a third dielectric constant that is lower than the second dielectric constant after exposing the layer of silicon-containing dielectric material to the energy source.

24. The method of claim 23 further comprising the step of exposing the layer of silicon-containing dielectric material to a low-energy plasma source prior to exposing the layer of silicon-containing dielectric material to the energy source.

25. The method of claim 23 wherein the UV radiation is monochromatic UV radiation.

26. The method of claim 23 wherein the contacting step is performed by a chemical vapor deposition process.

27. The method of claim 26 wherein the silicon-containing fluid is at least one selected from the group consisting of: methyltrimethoxysilane, methyltriethoxysilane, methyltri-n-propoxysilane, methyltriisopropoxysilane, ethyltrimethoxysilane, ethyltriethoxysilane, dimethyldimethoxysilane, dimethyldiethoxysilane, diethyldimethoxysilane, diethyldiethoxysilane, diethoxymethylsilane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, 2,2,4,6,6-pentamethyl-2,4,6-trisila-heptane, 1,methyl-1-ethoxy-silacyclopentane, 1,1,3,3-tetramethyl-1,3-disilacyclobutane, 1,3-dimethyl-1,3-diethoxy-1,3-disilacyclobutane, bis(trimethylsilylmethyl) benzene, (tridecafluoro-1,1,2,2-tetrahydrooctyl) triethoxysilane, bis(dimethoxymethylsilyl)methane, bis(diethoxymethylsilyl)methane, bis(dimethoxyphenylsilyl) methane, bis(diethoxyphenylsilyl)methane, bis(methoxydimethylsilyl)methane, bis(ethoxydimethylsilyl) methane, bis(methoxydiphenylsilyl)methane, bis(ethoxydiphenylsilyl)methane, hexamethyldisilazane, hexamethylcyclotrisilazane, heptamethyldisilazane, octamethylcyclotetrasilazane, nonamethyltrisilazane, dimethylcyclosilazane, acetoxytrimethylsilane, methoxytrimethylsilane, ethoxytrimethylsilane, 3-aminopropyldimethylethoxysilane, 3-aminopropylmethyldiethoxysilane, bis(dimethylamino)dimethylsilane, dimethylaminotrimethylsilane, aminomethyltrimethylsilane, octamethylcyclotetrasiloxane, tetramethylcyclotetrasiloxane, methyltriacetoxysilane, methylethoxysilacyclopropane, hexamethylsilabutane, dimethyldiacetoxysilane, and di-tert-butoxydiacetoxysilane.

28. The method of claim 27 wherein the silicon-containing fluid is at least one selected from the group consisting of: hexamethyldisilazane, hexamethylcyclotrisilazane, heptamethyldisilazane, octamethylcyclotetrasilazane, nonamethyltrisilazane, dimethylcyclosilazane, acetoxytrimethylsilane, methoxytrimethylsilane, ethoxytrimethylsilane, 3-aminopropyldimethylethoxysilane, 3-aminopropylmethyldiethoxysilane, bis(dimethylamino)dimethylsilane, dimethylaminotrimethylsilane, aminomethyltrimethylsilane, octamethylcyclotetrasiloxane, tetramethylcyclotetrasiloxane, hexamethylcyclotrisiloxane, decamethylcyclopentasilane, dodecamethylcyclohexasilane, 2,2,4,6,6-pentamethyl-2,4,6-trisila-heptane, 1,methyl-1-ethoxy-silacyclopentane, 1,1,3,3-tetramethyl-1,3-disilacyclobutane, 1,3-dimethyl-1,3-diethoxy-1,3-disilacyclobutane, bis(trimethylsilylmethyl)benzene, dimethydimethoxysilane, dimethyldiethoxysilane, methyltriethoxysilane, methyltrimethoxysilane, and (tridecafluoro-1,1,2,2-tetrahydrooctyl)triethoxysilane.

29. The method of claim 28 wherein the silicon-containing fluid is at least one selected from the group consisting of: diethoxymethylsilane, dimethyldiacetoxysilane, methyltriacetoxysilane, di-tert-butoxydiacetoxysilane, dimethyldimethoxysilane, and methyltriethoxysilane.

30. The method of claim 29 wherein the silicon-containing fluid comprises at least one of acetoxytrimethylsilane, methyltriacetoxysilane, and dimethyldiacetoxysilane.

31. The method of claim 23 wherein the layer of silicon-containing dielectric material is porous.

32. The method of claim 23 wherein the first dielectric constant is from about 1.5 to about 3.5, the second dielectric constant is from about 5% to about 150% higher than the first dielectric constant and the third dielectric constant is from about 10% to about 150% recovered relative to the second dielectric constant.

33. The method of claim 32 wherein the first dielectric constant is from about 1.5 to about 2.8.

34. The method of claim 33 wherein the first dielectric constant is from about 1.8 to about 2.7.

35. The method of claim 23 wherein the layer of silicon-containing dielectric material has a dielectric constant that is within 10% of the third dielectric constant after exposure to a temperature of at least 400° C.

36. The method of claim 23 wherein the silicon-containing fluid comprises at least one selected from the group consisting of: a linear silazane, a cyclic silazane, a cyclic organosiloxane, an organosiloxane, an alkylalkoxysilane, an alkylacetoxysilane, an alkylchlorosilane, a carbosilane, an aminoalkylsilane, an alkylaminoalkylsilane, and an aminoalkylalkoxysilane.

37. The method of claim 36 wherein the silicon-containing fluid comprises an alkylacetoxysilane.

38. A method for restoring a dielectric constant of a layer of a silicon-containing dielectric material having a first dielectric constant and at least one surface, wherein the first dielectric constant of the layer of silicon-containing dielectric material has increased to a second dielectric constant, the method comprising the steps of:
    contacting the at least one surface of the layer of silicon-containing dielectric material with a silicon-containing fluid comprising an alkylalkoxysilane;
    removing a first portion of the silicon-containing fluid such that a second portion of the silicon-containing fluid remains in contact with the at least one surface of the layer of silicon-containing dielectric material; and
    exposing the at least one surface of the layer of silicon-containing dielectric material to UV radiation and thermal energy, wherein the layer of silicon-containing dielectric material has a third dielectric constant that is lower than the second dielectric constant after exposing the layer of silicon-containing dielectric material to the energy source.

39. The method of claim 38 wherein the alkylalkoxysilane is at least one selected from the group consisting of: methyltriethoxysilane, methyltrimethoxysilane, methyltripropoxysilane, dimethyldimethoxysilane, dimethyldiethoxysilane, dimethyldipropoxysilane, trimethylmethoxysilane, trimethylethoxysilane, and trimethylpropoxysilane.

40. The method of claim 39 wherein the alkylalkoxysilane is methyltriethoxysilane.

41. The method of claim 39 wherein the alkylalkoxysilane is dimethyldimethoxysilane.

42. The method of claim 38 wherein the layer of silicon-containing dielectric material is porous.

43. The method of claim 42 wherein the first dielectric constant is from about 1.5 to about 3.5, the second dielectric constant is from about 5% to about 150% higher than the first dielectric constant and the third dielectric constant is from about 10% to about 150% recovered relative to the second dielectric constant.

44. The method of claim 43 wherein the first dielectric constant is from about 1.5 to about 2.8.

45. The method of claim 44 wherein the first dielectric constant is from about 1.8 to about 2.7.

46. The method of claim 38 wherein the layer of silicon-containing dielectric material has a dielectric constant that is within 10% of the third dielectric constant after exposure to a temperature of at least 400° C.

* * * * *